(12) United States Patent
Borland et al.

(10) Patent No.: US 8,183,108 B2
(45) Date of Patent: May 22, 2012

(54) GLASS FLUX ASSISTED SINTERING OF CHEMICAL SOLUTION DEPOSITED THIN DIELECTRIC FILMS

(75) Inventors: William J. Borland, Cary, NC (US); Seigi Suh, Cary, NC (US); Jon-Paul Maria, Raleigh, NC (US); Jon Fredrick Ihlefeld, Raleigh, NC (US); Ian Burn, Hockessin, DE (US)

(73) Assignee: CDA Processing Limited Liability Company, Wilmington, DE (US)

( * ) Notice: Subject to any disclaimer, the term of this patent is extended or adjusted under 35 U.S.C. 154(b) by 498 days.

(21) Appl. No.: 12/301,791

(22) PCT Filed: Jun. 15, 2006

(86) PCT No.: PCT/US2006/023457
§ 371 (c)(1),
(2), (4) Date: Nov. 21, 2008

(87) PCT Pub. No.: WO2007/145630
PCT Pub. Date: Dec. 21, 2007

(65) Prior Publication Data
US 2010/0230149 A1    Sep. 16, 2010

(51) Int. Cl.
*H01L 21/20* (2006.01)
*H01B 3/20* (2006.01)
*H01B 3/00* (2006.01)

(52) U.S. Cl. ............... 438/240; 252/572; 174/137 B
(58) Field of Classification Search ............ 438/381; 361/321.1; 427/79; 29/25.42
See application file for complete search history.

(56) References Cited

U.S. PATENT DOCUMENTS

| 5,296,426 | A | * | 3/1994 | Burn | 501/139 |
| 6,126,743 | A | | 10/2000 | Saegusa et al. | |
| 7,020,941 | B2 | * | 4/2006 | Chazono et al. | 29/25.41 |
| 7,029,971 | B2 | | 4/2006 | Borland et al. | |

OTHER PUBLICATIONS

Le Dren, S. et al., Investigation of factors affecting the preparation of PZT thick films, Materials Research Bulletin, 2000, pp. 2037-2045, vol. 35, Elsevier Science Ltd.
Jang, Soo-Ik et al., Structure and electrical properties of boron-added (Ba,Sr)TiO3 thick films fabricated by the sol-gel method, Thin Solid Films, 1998, pp. 89-95, vol. 330, Elsevier Science S.A.
Yang, Xiaojing et al., The dielectrical properties of (B,Si) doped (Ba,Sr)TiO3 thin films fabricated by sol-gel technique, Ceramics International, 2004, pp. 1763-1765, vol. 30, Elsevier Ltd. and Techna Group S.r.l.
Yao, Kui et al, Barium titanate glass-ceramic thin films for integrated high-dielectric media, Thin Solid Films, 2002, pp. 11-14, vol. 408, Elsevier Science B.V.
Saegusa, Kunio, Preparation and Electrical Properties of Sol-Gel Derived Lead Zirconate Titanate Glass-Ceramic Thin Films on Metal Foil Substrates, Jpn. J. Appl. Phys., Nov. 1997, pp. 6888-6893, vol. 36, Part 1, No. 11.

(Continued)

*Primary Examiner* — William D Coleman

(57) ABSTRACT

A method of making dense dielectrics layers via chemical solution deposition by adding inorganic glass fluxed material to high dielectric constant compositions, depositing the resultant mixture onto a substrate and annealing the substrate at temperatures between the softening point of the inorganic glass flux and the melting point of the substrate. A method of making a capacitor comprising a dense dielectric layer.

10 Claims, 25 Drawing Sheets

OTHER PUBLICATIONS

Saegusa, Kunio, Preparation by a Sol-Gel Process and Dielectric Properties of Lead Zirconate Titanate Glass-Ceramic Thin Films, Jpn. J. Appl. Phys., Jun. 1997, pp. 3602-3608, vol. 36, Part 1, No. 6A.

Saegusa, Kunio, PbTiO3-PbO-SiO2 Glass-Ceramic Thin Film by a Sol-Gel Process, J. Am Ceram. Soc., 1997, pp. 2510-2516, vol. 80, No. 10.

Yao, Kui et al., Self-Mending of Microcracks in Barium Titanate Glass-Ceramic Thin Films with High Dielectric Constant, J. Am. Ceram. Soc., 2002, pp. 496-498, vol. 85, No. 2.

International Preliminary Report on Patentability issued in PCT/US2006/023457 and issued Dec. 16, 2008.

International Search Report and Written Opinion issued in PCT/US2006/023457 and mailed on Mar. 27, 2007.

* cited by examiner

GLASS FLUX ASSISTED SINTERING OF CHEMICAL SOLUTION DEPOSITED THIN DIELECTRIC FILMS

BACKGROUND

1. Technical Field

The technical field is embedded capacitors, particularly capacitors having thin film dielectrics.

2. Related Art

The practice of embedding capacitors in printed wiring boards (PWB) allows for reduced circuit size and improved circuit performance. Capacitors are typically embedded in panels that are stacked and connected by interconnection circuitry, the stack of panels forming a printed wiring board.

Fired-on-foil thin-film capacitor technology is known. U.S. Pat. No. 7,029,971 to Borland et al. discloses a chemical solution deposition (CSD) fired-on-foil thin-film process in which fired-on-foil thin-film CSD capacitors are formed by first depositing a thin capacitor dielectric precursor material layer onto a metallic foil substrate, typically by spin coating. Several spin-coated layers may be utilized. The metallic foil substrate may be copper foil and typically may range in thickness between 12 and 36 microns. The deposited CSD thin-film capacitor dielectric material is subjected to a firing or annealing process to crystallize the dielectric and increase the grain growth and consequently the dielectric constant. The firing process may be conducted at high temperatures, such as 900° C., in a reduced oxygen atmosphere to avoid oxidation of the underlying metallic foil. After firing, the dielectric layer will generally be a homogenous ceramic layer and may have a thickness of approximately 0.6 microns.

A metallic electrode is next deposited over the fired-on-foil thin-film ceramic capacitor dielectric layer. The deposition method for the electrode can be any of a number of deposition methods. Sputtering is generally the preferred choice. After deposition of the electrode, the thin-film capacitor may exhibit a high capacitance density and other desirable properties.

Embedded ceramic capacitors are subject to requirements such as high capacitance density, acceptable breakdown voltage, low dielectric loss, and high reliability, for example.

A high capacitance density capacitor can be achieved by using a thin film and a high dielectric constant dielectric in the capacitor. A requirement for high reliability and good breakdown voltage is a high level of densification, typically close to 100% density wherein any porosity in the film is isolated. Firing a CSD dielectric deposit on copper foil restricts the shrinkage to the "z" or vertical dimension when sintering takes place and combined with the high level of refractoriness exhibited by high dielectric constant materials, achieving high levels of densification is extremely difficult. When fired at 900° C., CSD dielectrics having six or fewer layers totaling between 0.5 and 1.0 microns in fired thickness, typically achieve densification percentages of 60-80%, the rest of the dielectric being porosity, the majority of which is interconnected. In addition to the reliability concerns, since air has a dielectric constant of 1, such levels of porosity will result in a reduction of the dielectric constant.

Thus, a problem to be solved in present electronic circuitry is the production of a dense CSD dielectric of a fired-on-foil capacitor while maintaining other desirable properties, such as high capacitance density. Firing at higher temperatures may be one approach to achieving higher levels of densification but the firing temperature has to be lower than the melting point of the metallic foil. In the case of copper foil, the firing temperature has to be less than approximately 1050° C. Accordingly, one mechanism for solving the problem of making a dense CSD dielectric is the addition of an inorganic glass flux to the dielectric precursor material, which acts to lower the annealing temperature of the dielectric whereby the foil does not melt.

SUMMARY

Described herein is a method of making a dense CSD dielectric of a fired-on-foil capacitor, the steps of which comprise adding a small amount of an inorganic glass to high dielectric constant precursor material;

forming a dielectric over a metallic foil; and firing the dielectric layer at a higher temperature than the softening or melting point of the glass but at a lower temperature than the melting point of the foil. Also described is a method of making a capacitor comprising such a dense CSD dielectric.

BRIEF DESCRIPTION OF THE DRAWINGS

The various features of the drawings discussed below may not necessarily be drawn to scale. Dimensions of various features and elements in the drawings may be expanded or reduced to more clearly illustrate the embodiments of the invention. The detailed description will refer to the following drawings, wherein like numerals refer to like elements, and wherein.

DETAILED DESCRIPTION

Figure 1:
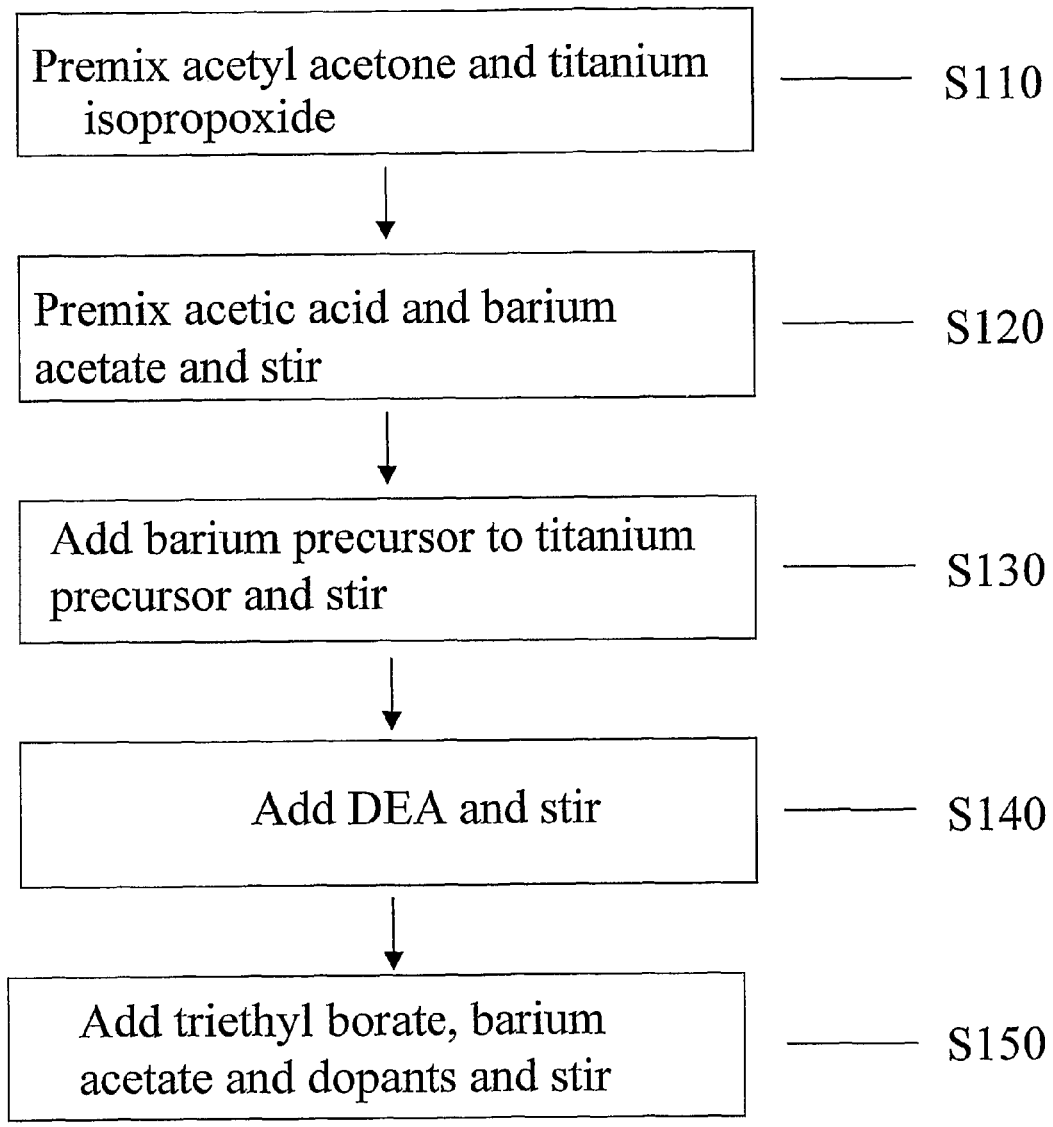
FIG. 1 is a block diagram showing the preparation method for a barium borate fluxed doped precursor solution of a barium titanate, dense dielectric.

As used herein, high dielectric constant is equivalent to high dielectric permittivity and refers to a value greater than 2000.

As used herein, "flux" refers to a fluid material that increases the rate of transfer of materials thereby, promoting densification.

As used herein, the term "glass flux" or "inorganic glass flux" refers to glass compositions that when melted during annealing acts as a flux for the dielectric.

Described herein are methods of making a dense dielectric composition with high capacitance density and deposited as a dielectric layer via chemical solution deposition by the addition of a small amount of an inorganic glass flux to high dielectric constant precursor material. Also described herein are methods of making capacitors that comprise the dense dielectric composition described herein. The capacitance density of a dielectric is proportional to its permittivity divided by the thickness of the dielectric. A high capacitance density capacitor is therefore achieved by using a thin film and a high dielectric constant dielectric composition in the capacitor.

Since during firing or annealing, the high dielectric constant material on its own creates a less dense dielectric, the addition of the small amount of inorganic glass flux provides the technical solution of this invention. Specifically, addition of the small amount of an inorganic glass flux facilitates the densification of the high dielectric constant material by liquid phase, rather than by solid phase, sintering. Accordingly, the dielectric material more easily achieves a high sintered density while maintaining its high capacitance density.

The dielectric constant of a fired dielectric composition is affected by the amount of any separate second phase it contains. The dielectric constant of the fired dielectric composition, which may be a resultant film, may be calculated approximately when the volume and dielectric constant of the second phase are known. A number of mathematical equations or analyses may be used. One such analysis is:

$$\text{Log } DK(\text{comp}) = Vf(\text{incl}) * \text{Log } DK(\text{incl}) + Vf(hk \text{ mat}) * \text{Log } DK(hk \text{ mat}),$$

where:
Log DK(comp) is the log value of the dielectric constant of the resultant film;
Vf(incl) is the volume fraction of the second phase;
Log DK(incl) is the log value of the dielectric constant of the second phase;
Vf(hk mat) is the volume fraction of the high dielectric constant material;
Log DK(hk mat) is the log value of the dielectric constant of the high dielectric constant material.

In the above mathematical analysis, the second phase must be a distinct separate phase from the high dielectric constant material. Such a second phase may be air or a glass. Therefore, since the dielectric constant of air is 1 and the glasses used in this method have higher dielectric constants than that of air, simply replacing air by glass flux would tend to raise the dielectric constant of the dielectric composition, if all else remains the same. However, the use of only small amounts of an appropriate glass flux can provide for significant lowering of the porosity level so that the resultant film has a significantly higher dielectric constant as long as all other factors, such as final grain size, remain constant.

A requirement for a high dielectric constant material is the formation of a polar non-centrosymmetric phase. In order to form this phase, which is generally tetragonal, but may be rhombohedral, orthorhombic, or monoclinic, a minimum crystalline grain size in the dielectric typically must be exceeded. Perovskites of the general formula $ABO_3$ have such a crystalline dimension requirement. Such perovskites include crystalline barium titanate (BT), lead zirconate titanate (PZT), lead lanthanum zirconate titanate (PLZT), lead magnesium niobate (PMN) and barium strontium titanate (BST). For example, in polycrystalline $BaTiO_3$-based materials, the dielectric constant falls precipitously when the average grain size falls below 0.1 micron. Therefore, it is desirable to have barium titanate average grain sizes in excess of this dimension. These structures are therefore useful as starting, i.e., precursor, material to form the high permittivity or high dielectric constant compositions, which form the films or layers described herein.

The thin-film dielectrics described herein have dense microstructures and depending on the glass flux chosen may exhibit dielectric constants or dielectric permittivities considerably higher than their unfluxed counterparts. These thin film dielectrics are economically deposited with 6 or fewer coatings, have robust fired thicknesses in the range of about 0.5 to 1.0 micron and have acceptable capacitance stability over a desired temperature range and low dielectric losses.

Since crystalline barium titanate and barium strontium titanate films with appropriate grain sizes display high dielectric constants and are lead free, these are particularly useful to produce dense dielectric layers from which very high capacitance density devices may be fabricated. Briefly, the present composition may be used as a dense dielectric layer formed over metallic foil. A conductive layer is then formed over the dense dielectric layer, such that the foil, the dense dielectric layer, and the conductive layer form the high capacitance density capacitor. These capacitors have dense dielectric microstructures and may be embedded into innerlayer panels, which in turn may be incorporated into printed wiring boards. Depending upon the composition of the inorganic glass flux added to the dielectric precursor material, grain growth can be minimized or promoted, thereby providing capacitors having correspondingly lower or higher dielectric constants than their unfluxed counterparts.

Substituent and dopant cations may be added to the fluxed high dielectric constant material to improve the dielectric properties. The properties desired in the dense-dielectric capacitor will dictate the particular combination of added dopants.

Small quantities of suitable dopants include rare earth cations having the preferred oxide stoichiometry of $R_2O_3$, where R is a rare earth cation (e.g., Y, Ho, Dy, La, Eu). Rare earth dopants improve insulation resistance in the resulting dielectric.

Transition metal cation dopants such as Mn and Fe may also be used to improve the resistance to reduction in the dielectric and improve the insulation resistance. Other transition metal cations with the preferred oxide stoichiometry of $MO_2$, such as Zr, Hf, Sn, Ce, may also be suitable dopant cations. These transition metal cations smooth the temperature-dependence of permittivity in the dielectric by "pinching", i.e., shifting, the three phase transitions of $BaTiO_3$ closer to one another in temperature space.

Metal cations having the preferred oxide stoichiometry of MO, where M is an alkaline earth metal such Ca, Sr, Mg, may also be used to shift the dielectric temperature maxima to lower temperatures, further smoothing the temperature-dependent response of the dielectric.

The above-described dopants, or mixtures thereof, may be used with the fluxed perskovite, e.g., $BaTiO_3$, in various concentrations. A preferred range of concentrations is between about 0 and 5 mole percent of the final formulation.

Chemical solution deposition ["CSD"] techniques are used to form the dense dielectrics produced by the methods described herein. This is because CSD techniques are desirable due to their simplicity and low cost.

Chemical Precursor Solution

The chemical precursor solution contains the desired amount of each component of the desired high dielectric constant material as well as additives useful for achieving other goals, for example, the elimination of cracks. Thus, if the desired high dielectric constant material is barium titanate, the chemical precursor solution will comprise barium acetate and titanium isopropoxide. When heated, this solution initially decomposes to form very fine particles of barium oxide or carbonate and titanium dioxide. On subsequent heating, these react together to form the final composition barium titanate.

As an example to demonstrate the relationship between the chemical precursor solution and the desired high dielectric constant material, the chemistry for achieving barium titanate [$BaTiO_3$] is given. Unfluxed (or "pure") $BaTiO_3$ is prepared preferably from the following chemicals in their respective amounts:

| | |
|---|---|
| Barium acetate | 5.12 grams |
| Titanium isopropoxide | 5.68 grams |
| Acetylacetone | 4.12 milliliters |
| Acetic acid | 43.52 milliliters |

The acetic acid and acetylacetone are dissolving mediums for the barium acetate and the titanium isopropoxide.

Diethanolamine (DEA) may be added in the range of 8-12% of the weight of barium acetate in order to prevent cracking in the dielectric film. Thus, for example, to the precursor solution of the preceding paragraph, the DEA addition may total 0.58 g.

The desired precursor composition for the high dielectric constant material barium titanate having been produced, inorganic glass flux additions may be made to the precursor solution using the following: Barium acetate; triethyl borate or tri-n-butylborane; di-2-ethylhexyl phosphoric acid; and acetic Acid.

The following list of chemicals may be added to the above-described precursor solution to supply the listed cations. For example,
manganese acetate tetrahydrate to supply Mn;
yttrium acetate hydrate to supply Y;
zirconium propoxide to supply Zr;
calcium acetate hydrate to supply Ca;
strontium acetate hydrate to supply Sr;
holmium acetate hydrate to supply Ho;
dysprosium acetate hydrate to supply Dy;
Tetrakis(1-methoxy-2-methyl-2-propoxy)hafnium to supply Hf;
Iron acetate to supply Fe;
magnesium acetate tetrahydrate to supply Mg.

General Method

A general method for producing dense dielectrics described herein comprises designing a particular chemical precursor solution of specific compounds (as demonstrated above for barium titanate) that would, if fired, yield an unfluxed high dielectric constant material. To the chemical precursor solution is added glass fluxed material (and optionally dopants) to produce a fluxed mixture, which is deposited via chemical solution deposition to a substrate, generally a metallic foil. The coating may be heated to facilitate its drying at a temperature typically less than the annealing temperature. The coated substrate is then annealed (i.e., fired) in order to crystallize the chemical precursor solution and yield the desired dielectric. A feature of the process described herein is that the annealing temperature falls within a prescribed range, that is, annealing occurs in a range that is higher than the softening point of the glass flux addition but lower than the melting point of the metallic foil substrate.

As discussed above, barium titanate (BT), lead zirconate titanate (PZT), lead lanthanum zirconate titanate (PLZT), lead magnesium niobate (PMN) and barium strontium titanate (BST) and mixtures of these are useful in forming the high permittivity or dielectric constant films or layers described herein. Moreover, crystalline barium titanate and barium strontium titanate produce particularly useful dense dielectric layers from which very high capacitance density devices may be fabricated.

FIG. 1 is a block diagram illustrating a process for preparing a precursor solution that will be used to form a dielectric according to the methods described herein. In step S110, titanium isopropoxide is premixed with acetylacetone. The premix step can be done in, for example, a PYREX® container. In step S120, acetic acid is added to barium acetate and stirred at room temperature to dissolve the barium acetate. In step S130, the barium acetate dissolved in acetic acid is added to the titanium isopropoxide and acetylacetone mixture and stirred. In step S140 the diethanolamine (DEA) is added to the solution and is stirred. In step S150, the desired amount of the flux composition, in this case, barium borate, and the desired amount of any doping chemicals chosen from the above list are added to the container, and the solution is stirred until the chemicals are dissolved. The precursor solution is now ready for deposition.

Deposition

Figure 2:
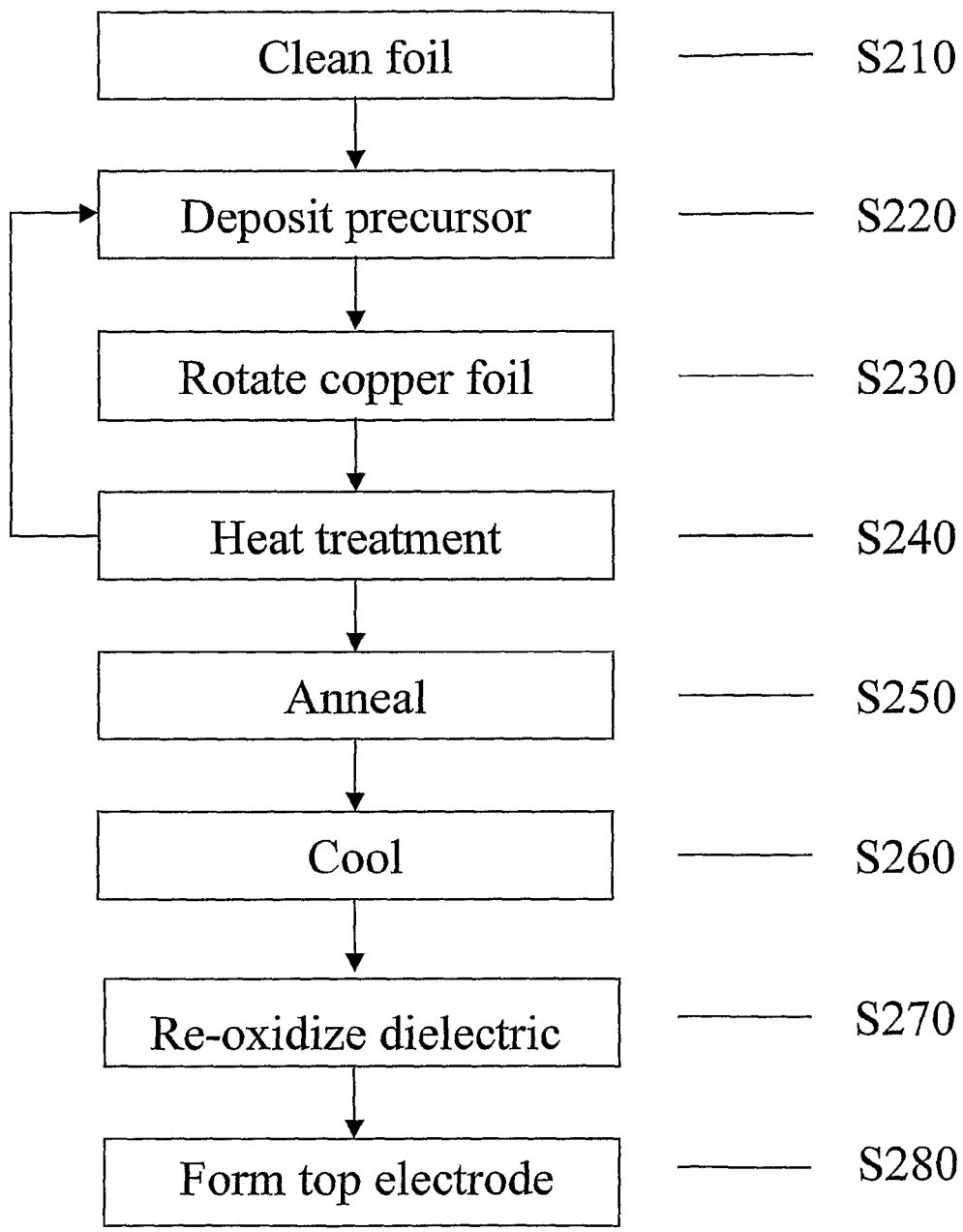
FIG. 2 is a block diagram showing the fabrication of a dense capacitor on copper foil.
Figure 3:
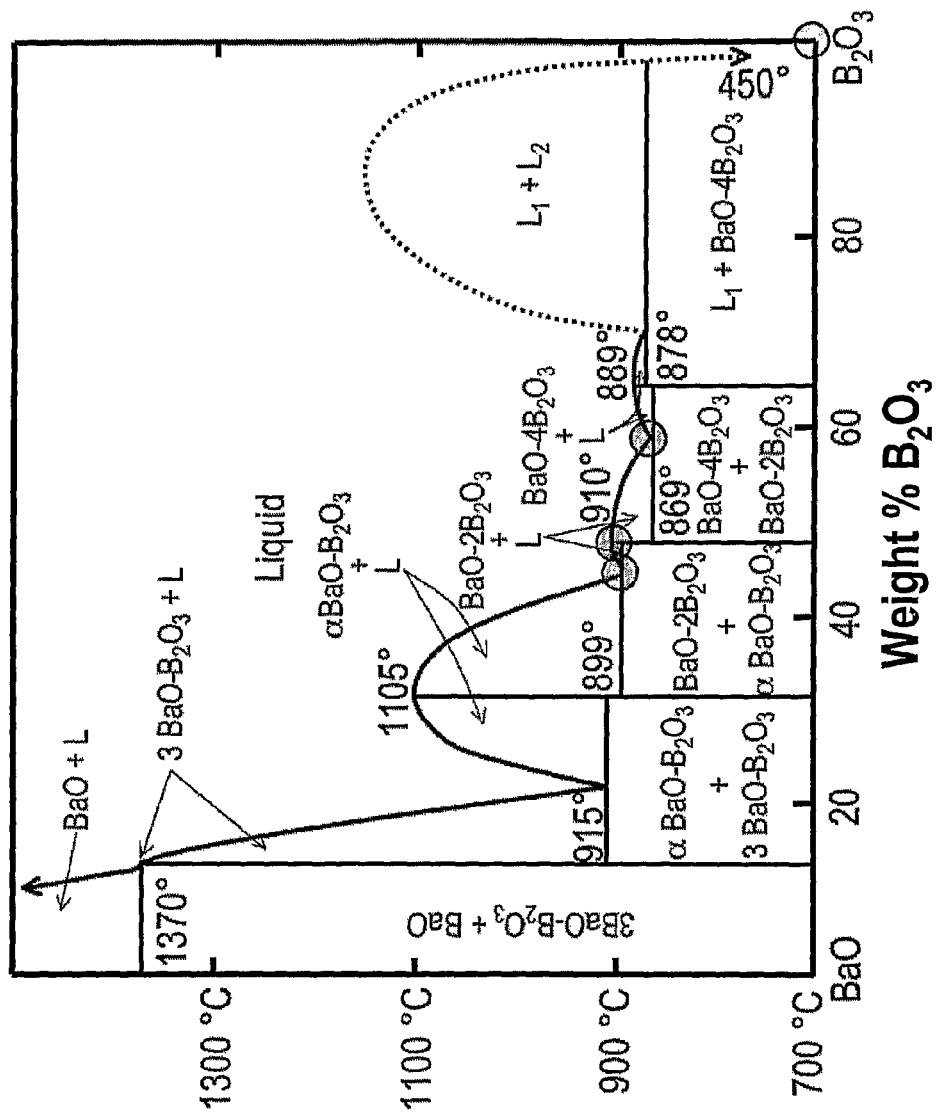
FIG. 3 is the barium oxide-boron oxide ($BaO—B_2O_3$) phase diagram showing the boron oxide and barium borate flux compositions used in this investigation and their melting points relating to 100% boron oxide, 25 mole percent ["mole %"] barium oxide-75 mole % boron oxide, 33 mole % barium oxide-67 mole % boron oxide, and 37 mole % barium oxide-63 mole % boron oxide

FIG. 2 is a block diagram of one method for forming a capacitor according to the present invention. The dielectric of the resultant capacitor may be formed using the precursor solution discussed above with reference to FIG. 1. Variants of the acetic acid, acetylacetone and titanium isopropoxide components in the above-described precursor solution may also be used. For example, acetic acid may be partially substituted by methanol, ethanol, isopropanol, acetone, butanol and other alcohols. Acetylacetone may be substituted by ethanolamines such as 3-ethanolamine, diethanolamine or monoethanolamine, for example. Titanium isopropoxide may be substituted with titanium butoxide.

The solution deposition method illustrated in FIG. 2 is spin coating. Other solution deposition methods, such as dip, slot die, gravure or spray coating, may also be used to deposit the precursor solution. The process illustrated in FIG. 2 discusses the formation of a single capacitor. Several capacitors can be formed in a batch mode, however, using the method illustrated in FIG. 2.

In step S210, a metallic foil is cleaned. The metallic foil may be made from copper. Copper foils are desirable due their low cost and ease of handling. The copper foil will serve as a substrate on which a capacitor is built. The copper foil also acts as a capacitor "bottom" electrode in the finished capacitor. In one embodiment, the substrate is an 18 μm thick electroless, copper foil. Other untreated foils, such as 1 oz copper foil, are also suitable. Suitable cleaning conditions include etching the foil for 30 seconds in a dilute solution of copper chloride in hydrochloric acid. The etching solution may be diluted approximately 10,000 times from its concentrated form. The cleaning process removes the excess oxide layer, fingerprints and other accumulated foreign matter from the foil. If the copper foil is received from a vendor or other source in a substantially clean condition, and is handled carefully and promptly used, the recommended cleaning process may be not be necessary.

The copper foil is preferably not treated with organic additives. Organic additives are sometimes applied in order to enhance adhesion of a metallic substrate to epoxy resins. Organic additives, however, may degrade the dielectric film during annealing.

In step S220, the precursor solution discussed above with reference to FIG. 1 is deposited over the copper foil substrate. The precursor solution may be applied using, for example, a plastic syringe. The precursor solution is deposited on the drum side (or "smooth side") of the copper foil substrate.

In step S230, the substrate is rotated for spin coating. A suitable rotation time and speed are 30 seconds at 3000 revolutions per minute. In step S240, the substrate is heat-treated. Heat treatment may be performed, for example, at a temperature of 250° C. for five to 10 minutes. Heat treatment is used to dry the precursor solution by evaporating solvents in the precursor solution. After heat treatment, the dried dielectric precursor layer is about 150 nm thick. Consecutive spinning steps may be used to coat the foil substrate to the desired thickness. Six spinning steps, for example, may be used to produce a final dried dielectric precursor thickness of approximately 1 μm.

Annealing

In step S250, the coated substrate is annealed. Annealing first removes residual organic material, and then densifies and crystallizes the dried dielectric precursor Annealing may be conducted in a high temperature, low oxygen partial pressure environment for dielectrics deposited on copper foil. A suitable total pressure environment is about 1 atmosphere. A suitable oxygen partial pressure for a dielectric on copper foil is between $10^{-10}$ and $10^{-12}$ atmospheres.

In step S250, the low oxygen partial pressure may be achieved by bubbling high purity nitrogen through a controlled temperature water bath. Other gas combinations such as additions of small amounts of hydrogen containing forming gas to the gas mixture are also possible. The annealing temperature should be higher than the softening point of the glass flux addition but lower than the melting point of the metallic foil substrate. In one embodiment, copper foil is used as the substrate, a 1 mole % addition of a composition consisting of 25 mole % barium oxide 75 mole % boron oxide is used as the flux, the furnace temperature is about 900° C., and the oxygen partial pressure is approximately $10^{-12}$ atmospheres. The water bath may be at a temperature of about 25° C. The annealing can be performed by inserting the coated foil substrate into a furnace at temperatures below 250° C. The furnace is then ramped up to 900° C. at a rate of about 30° C./minute. The furnace is maintained at 900° C. for 30 minutes.

The annealing temperature of 900° C. described above facilitates the use of copper foil as the substrate and allows the glass flux to soften and flow to create maximum densification of the dielectric Annealing also allows for crystallization of the deposited dielectric.

Favorable results may also be obtained at annealing temperatures higher than 900° C. Higher temperatures, for example 1200° C., combined with the appropriate atmosphere to avoid oxidation of the metallic substrate facilitate the use of various glass fluxes and various metallic substrates, such as nickel. Additionally, if the chemistry of the substrate so permits, annealing may be conducted in air, thereby dispensing with a reducing atmosphere. Such substrates may include precious metal foils or ceramic oxide compositions.

In general, dielectric constants of polycrystalline $BaTiO_3$-based materials fall precipitously when the average grain size falls below 0.1 micron. According to the choice of flux composition, typical average grain sizes of between 0.1 micron and 0.2 micron may be obtained in glass fluxed dielectrics, providing dielectric constant values in excess of 2500.

Higher dielectric constants may be achieved with larger grain sizes. Larger grain sizes may be obtained by the use of more flux of the appropriate composition, higher annealing temperatures or longer annealing periods, or combinations thereof. However, several grains across a dielectric film (i.e., the width of the film between electrodes) are desirable because they provide acceptable long-term capacitor reliability. Grain size may therefore be tailored to accommodate a desired thickness for the dielectric. For example, for a dielectric thickness of between 0.5 and 1.0 micron, an average grain size of between 0.1 and 0.2 micron allows for approximately 5 to 8 grains extending from one electrode to the other. In general, 5 or more grains across a dielectric are desirable for acceptable long-term capacitor reliability. For thicker dielectrics, such as dielectrics of 2 micron thickness, larger grain sizes in the range of between 0.2 and 0.4 micron may be acceptable and correspondingly higher dielectric constants may be realized. If dielectrics thinner than 0.5 micron are desired, smaller grains may be utilized by choice of an appropriate flux compositions that restricts grain growth.

The above-described annealing process for dielectrics on copper foil generally avoids oxidation of the copper foil to $Cu_2O$ or $CuO$. Oxidation is avoided by selecting an appropriate low oxygen partial pressure for the high processing temperature used during annealing in step S250. A range of oxygen partial pressures that reliably avoids oxidation of copper and does not deleteriously reduce the dielectric is between $1 \times 10^{-9}$ and $1 \times 10^{-14}$ atmospheres. Consequently, high quality $BaTiO_3$ or other high dielectric constant layers may be formed in the absence of any oxidation of the copper foil or severe dielectric degradation during annealing. Alternative metallic foils and annealing temperatures may require different atmospheres. These atmospheres may be calculated from the standard free energy of formation of oxides as a function of temperature as described by F. D. Richardson and J. H. E. Jeffes, J. Iron Steel Inst., 160: 261 (1948).

After Annealing

In step S260, the foil substrate is allowed to cool. Cooling may be simply switching the furnace off. Alternatively, the furnace temperature may be ramped down at a specific rate. When the furnace temperature reaches about 450° C., the foil substrate may be safely removed from the furnace without risk of undesired oxidation effects on the copper foil. Alternatively, the furnace may be allowed to return to room temperature before the foil substrate is removed from the furnace.

In step S270, the high dielectric constant dielectric layer or film may be subjected to a re-oxygenation process to improve insulation resistance of the dielectric. Re-oxygenation may correspond to a 30 minute anneal at 450° C., at an oxygen partial pressure of approximately $10^{-4}$ atmospheres. Re-oxygenation can be integrated into the cooling step S260, for example, or performed as a separate step after cooling. If appropriate acceptor dopants are used, the re-oxygenation step may be dispensed with. Such acceptor dopants include manganese, magnesium, etc.

In step S280, a "top" electrode is formed over the resulting dielectric. The foil substrate serves as the bottom electrode of the capacitor formed by this method. The top electrode can be formed by, for example, sputtering, combustion chemical vapor deposition, electroless plating, printing or other suitable deposition methods. In one embodiment, sputtered platinum electrodes are used. Other suitable materials for the top electrode include nickel, copper, and palladium. The top electrode may also be plated to increase its thickness.

EXAMPLES

The following examples illustrate useful properties in dielectric compositions and capacitors incorporating these compositions, prepared according to the methods described herein. In the examples below, when an amount, concentration, or other value or parameter is given as a range, as one or more preferred ranges or as a list of upper preferable values and lower preferable values, this is to be understood as specifically disclosing all ranges formed from any pair of any upper range limit or preferred value and any lower range limit or preferred value, regardless of whether such pairs are separately disclosed.

Examples 1-3

Figure 4:
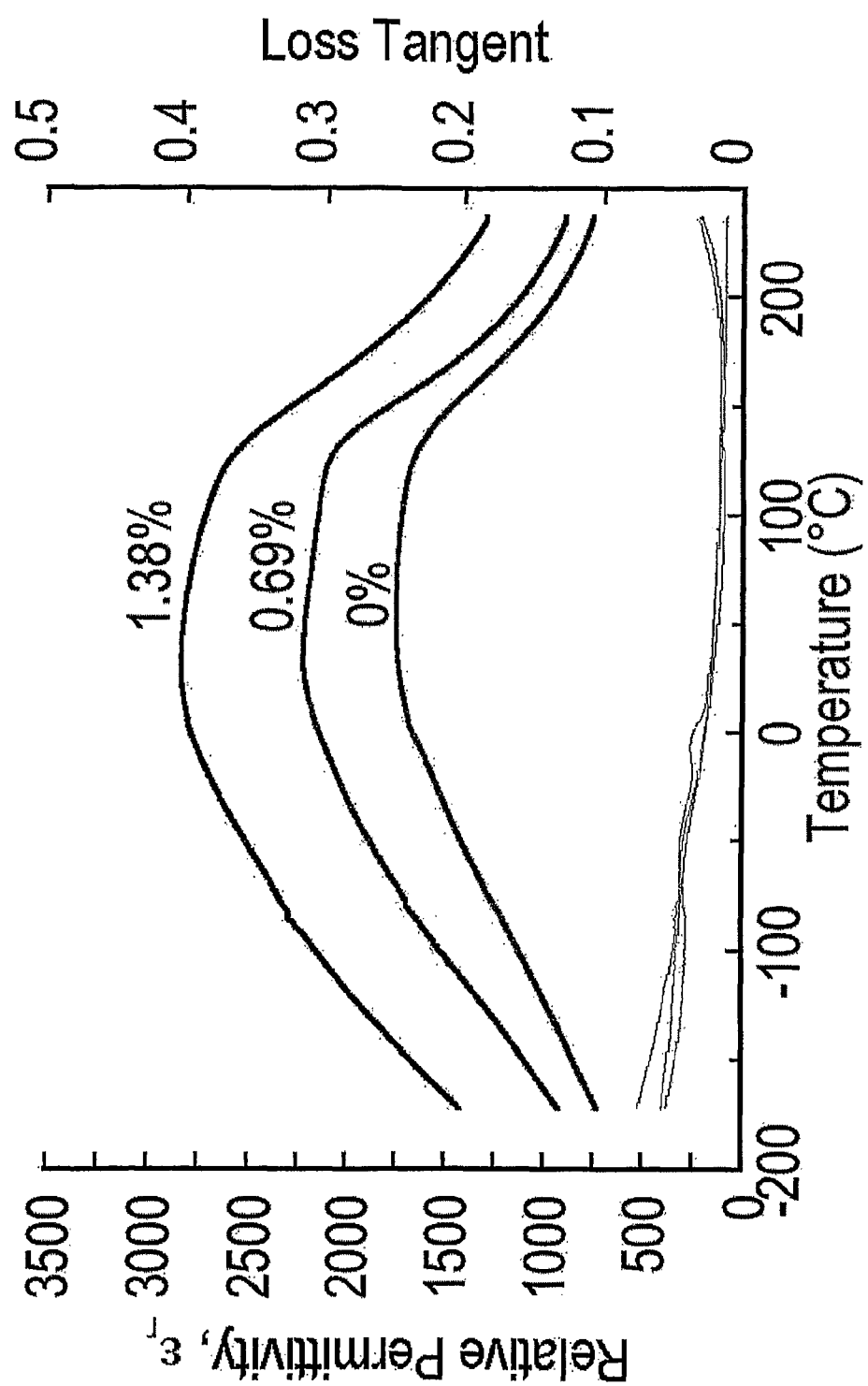
FIG. 4 is a plot of dielectric permittivity and loss tangent versus temperature of barium titanate thin films containing 0, 0.69, and 1.38 mole % additions of boron oxide glass flux to the dielectric.
Figure 5:
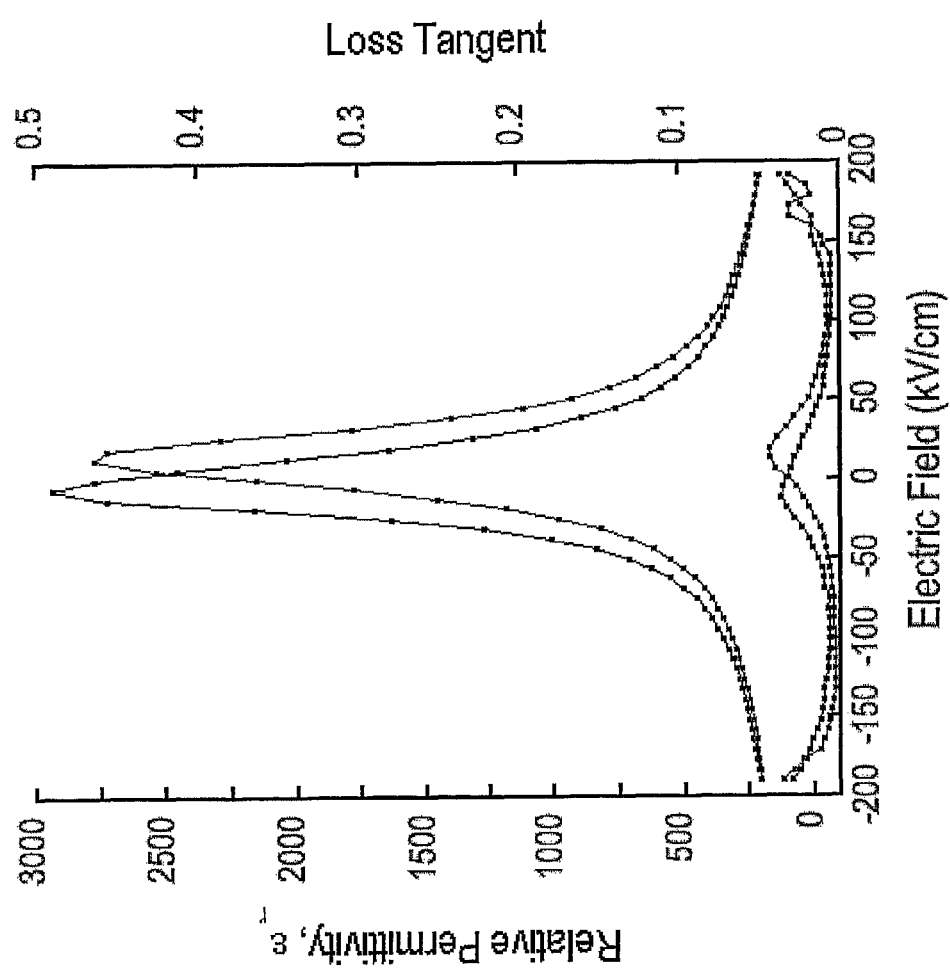
FIG. 5 is a plot of dielectric relative permittivity and loss factor versus field strength of a thin-film barium titanate capacitor on copper foil with an addition of 1.38 mole % boron oxide glass flux to the dielectric.
Figure 6A:
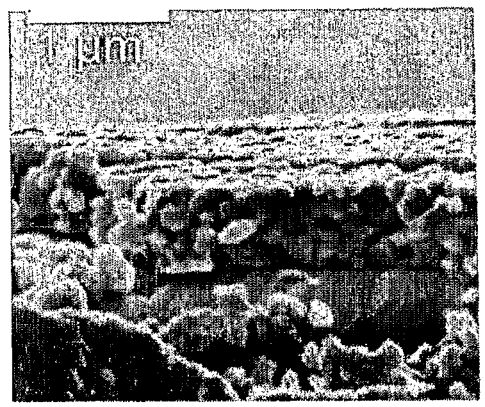
FIG. 6 (a-c) is series of cross-sectional scanning electron micrographs of fractured thin-film barium titanate capacitor dielectrics on copper foil with additions of 0.69, 1.38, and 2.76 mole % additions of boron oxide to the dielectric.
Figure 6B:
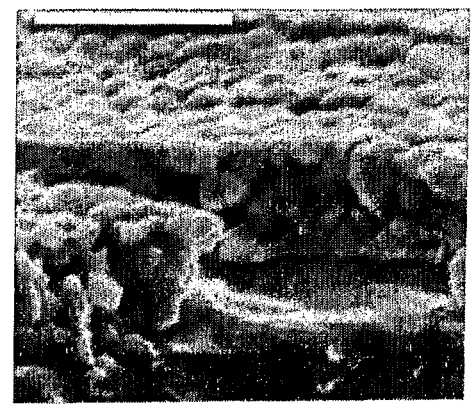
Figure 6C:
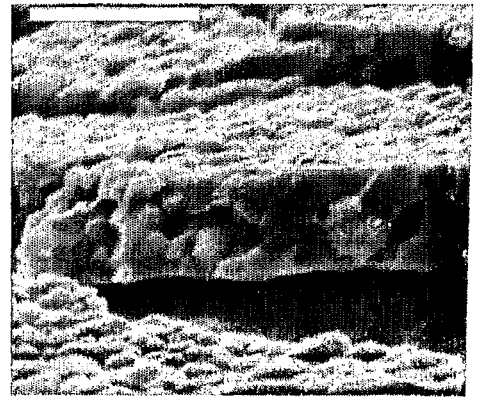
Figure 15:
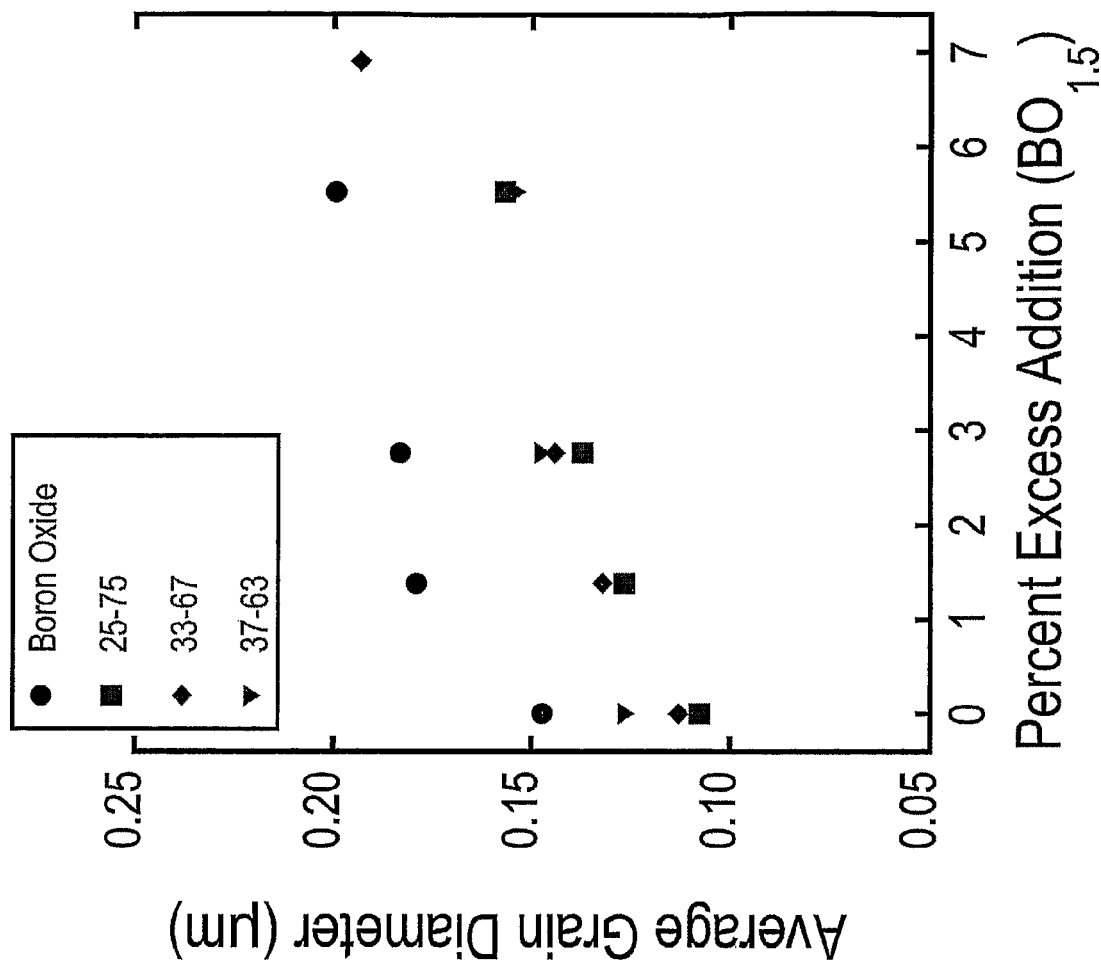
FIG. 15 is a graph of the effects of boron oxide and barium borate of varying boron oxide content on the grain size of thin-film barium titanate based films

Barium titanate thin-film capacitors were prepared on copper foil using the process as depicted in FIG. 2. The precursor compositions contained 0, 0.69, and 1.38 mole % boron oxide glass flux additions by addition of the appropriate amounts of triethyl borate to the barium titanate solution. Annealing was performed at 900° C. for 30 minutes, under an atmosphere of a partial pressure of oxygen of $10^{-12}$ atmospheres. The dielectric compositions were re-oxygenated after the annealing process for 30 minutes at 450° C., under a partial pressure of oxygen of $10^{-4}$ atmospheres. The resultant maximum dielectric constants or relative permittivities of the barium titanate films were approximately 1600, 2250, and a little less than 3000 for 0, 0.69, and 1.38 mole % boron oxide respectively as shown in FIG. 4. The relative permittivity and loss factor versus field strength of the barium titanate film containing an addition of 1.38 mole % boron oxide flux is shown in FIG. 5. Cross sectional scanning electron micrograph of fractured samples of the barium titanate films are shown in FIG. 6 (a-c). The effect of the boron oxide flux on the grain size of the barium titanate is shown in FIG. 15.

Examples 4-6

Figure 7A:
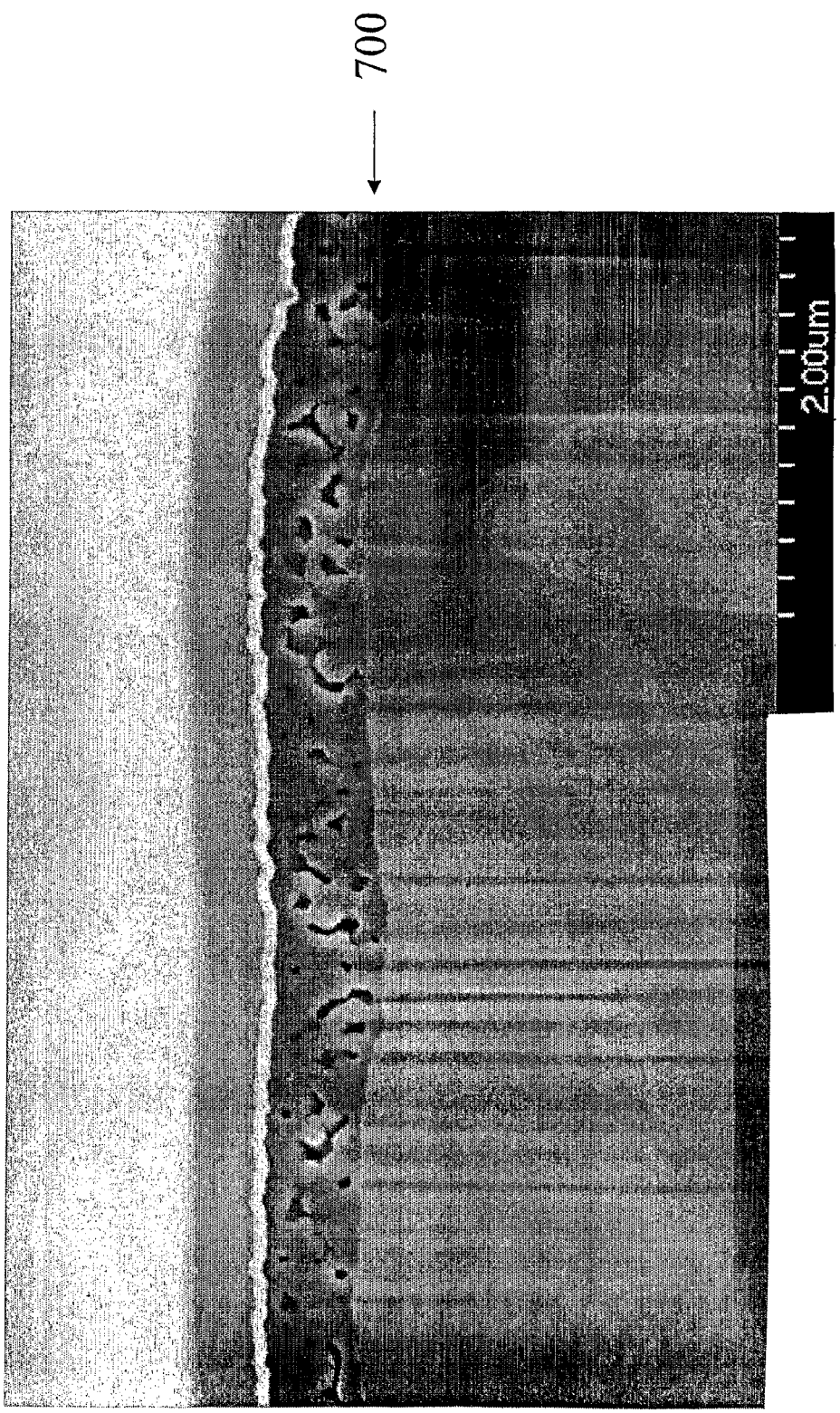
FIG. 7 (a-c) is series of FIB (focused ion beam) images of cross-sections of thin-film barium titanate capacitor dielectrics on copper foil with 0, 1.5, and 3.0 mole % additions of boron oxide to the dielectric wherein the dielectric layer is identified by the marker 700.
Figure 7B:
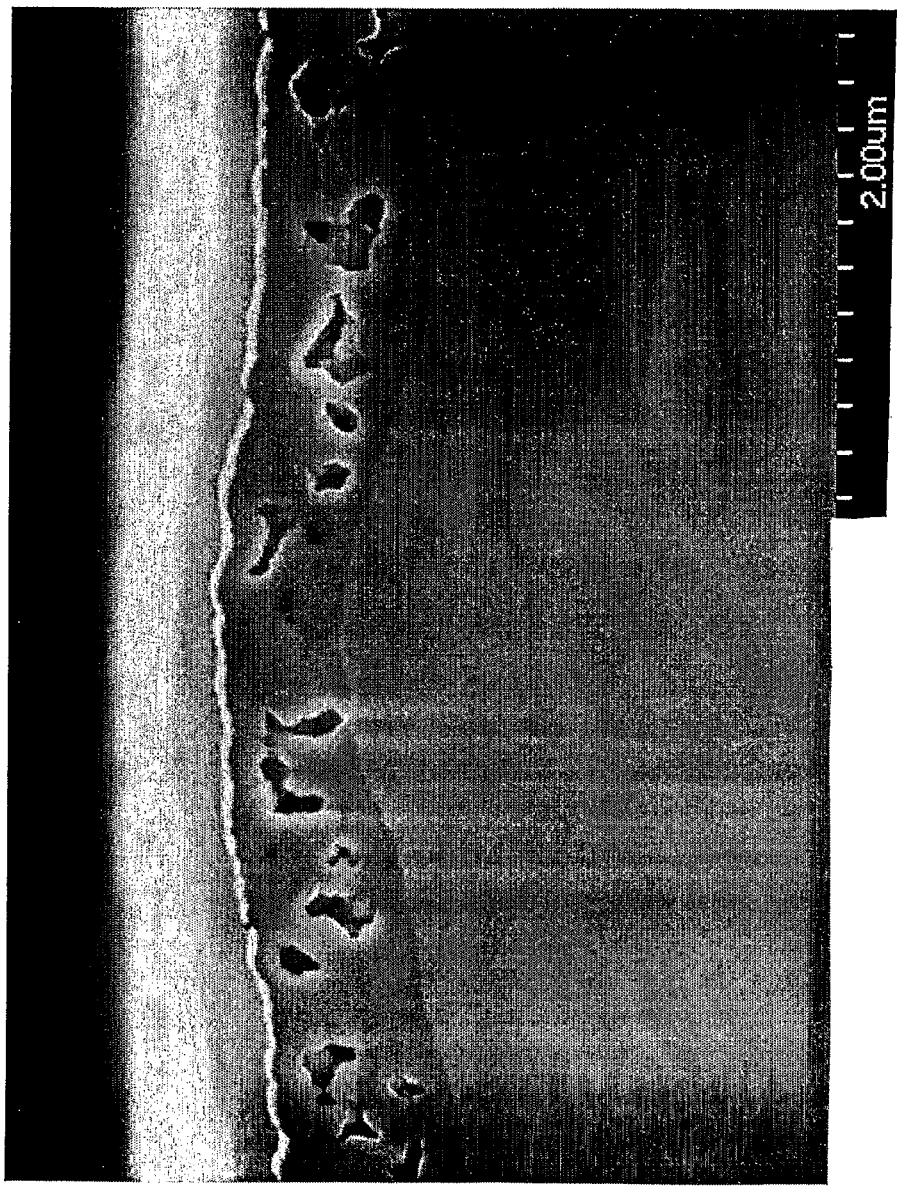
Figure 7C:
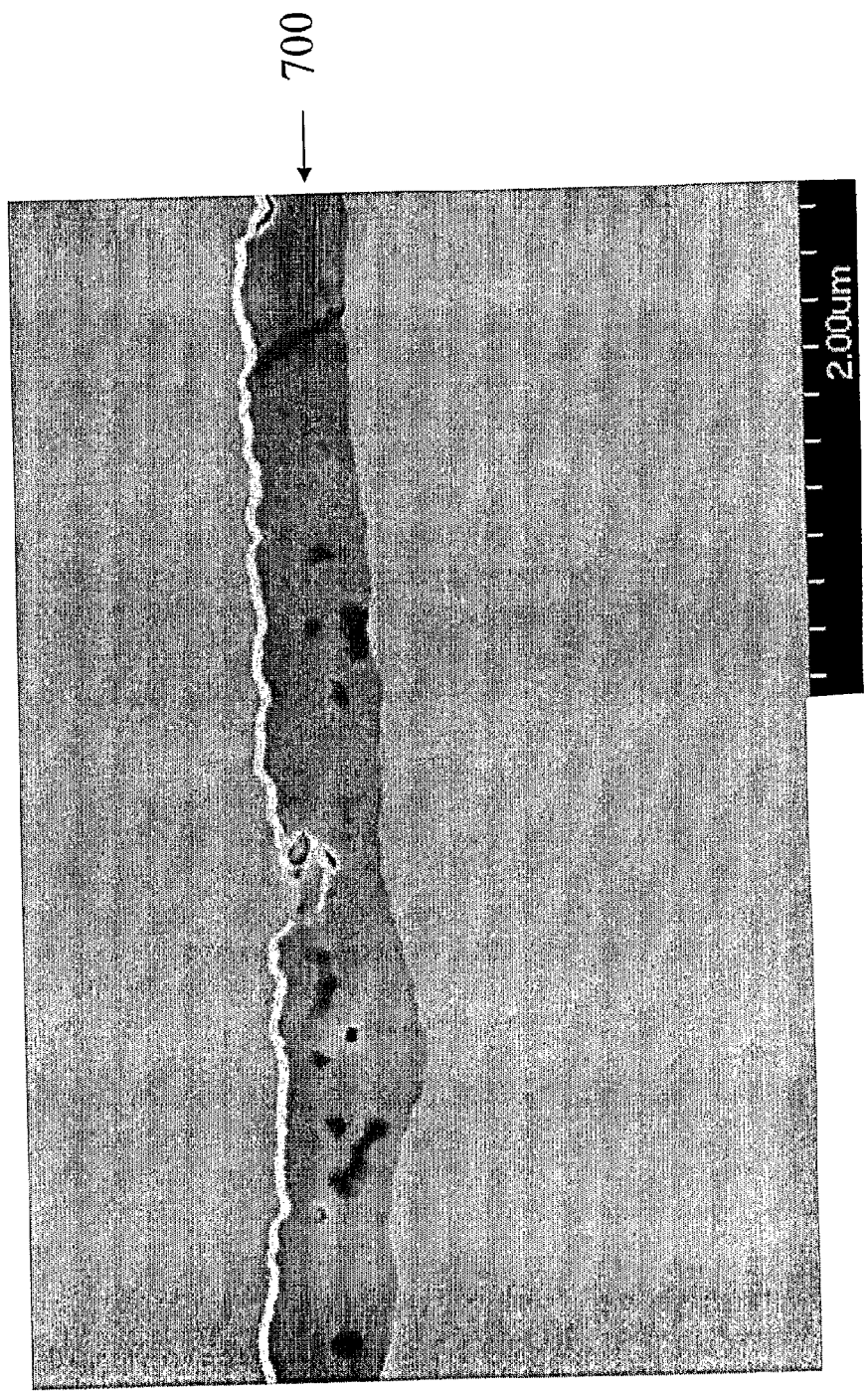

Barium titanate thin-film capacitors were prepared on copper foil using the process as described in FIG. 2. The compositions contained 0, 1.5, and 3.0 mole % boron oxide glass flux additions by addition of the appropriate amounts of tri-n-butylborate to the barium titanate solution Annealing was performed at 900° C. for 30 minutes, under an atmosphere of a partial pressure of oxygen of $10^{-12}$ atmospheres. Cross-sections of the dielectrics were made and focused ion beam (FIB) images were taken of the cross-sections to show the porosity level. The images are shown in FIG. 7 (a-c) wherein the dielectric layer is identified by the marker 700.

Examples 7-9

Figure 8:
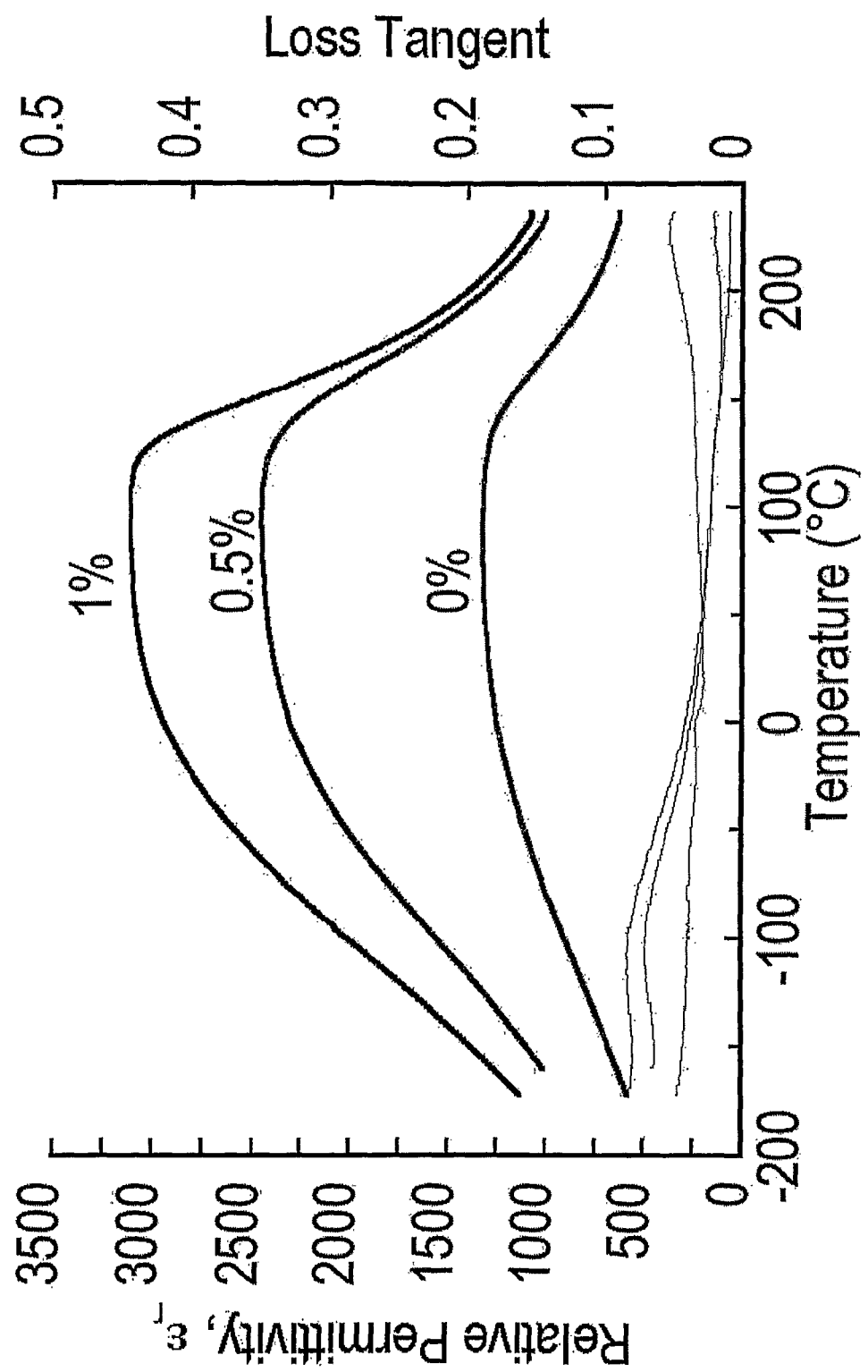
FIG. 8 is a plot of dielectric permittivity and loss tangent versus temperature of barium titanate thin films containing 0, 0.5, and 1 mole % additions of barium borate (25 mole % barium oxide-75 mole % boron oxide) glass flux to the dielectric.
Figure 9:
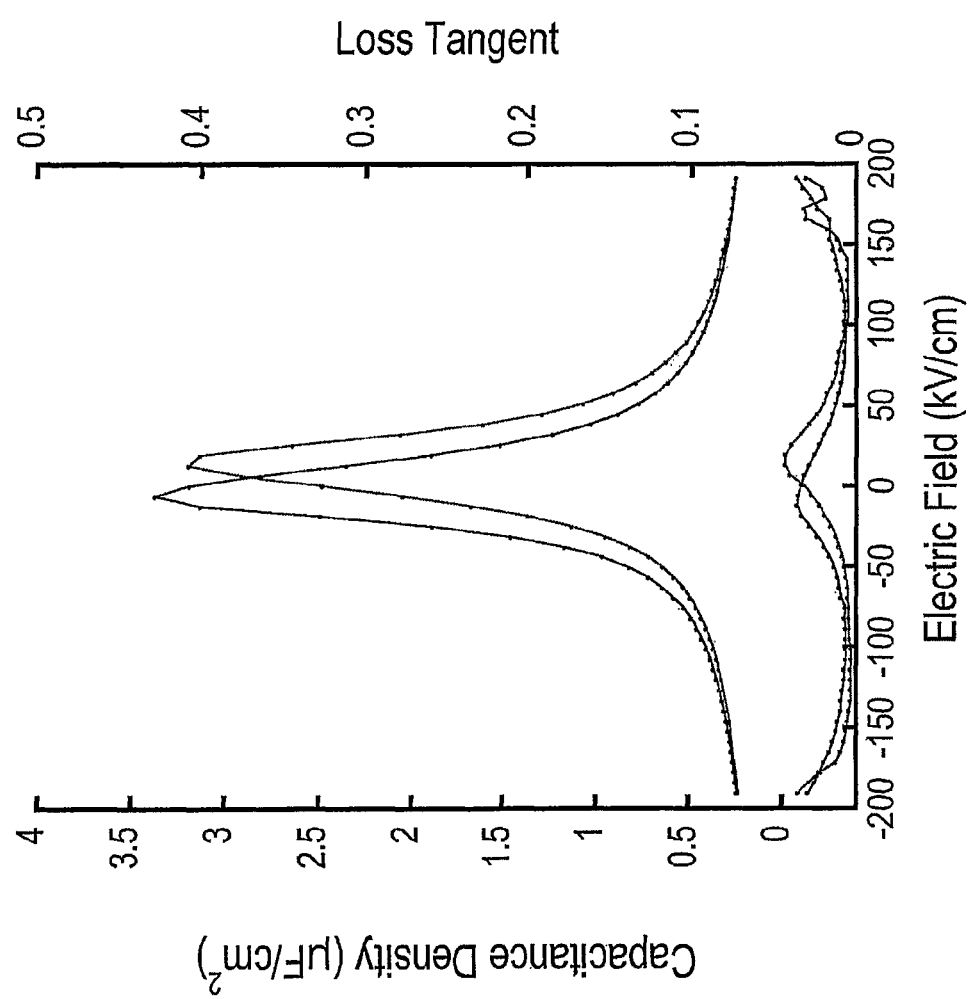
FIG. 9 is a plot showing the capacitance density and loss factor of thin-film barium titanate capacitors on copper foil versus field strength with a 1 mole % addition of barium borate (25 mole % barium oxide-75 mole % boron oxide) glass flux to the dielectric.
Figure 10A:
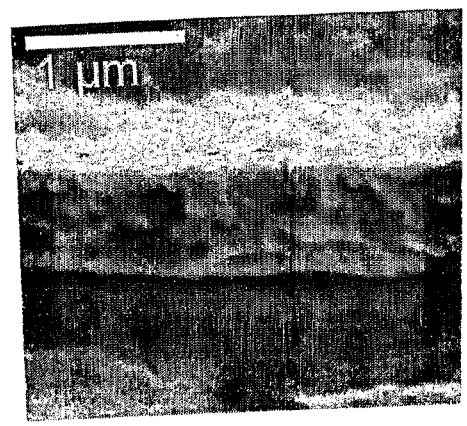
FIG. 10 is series of cross-sectional scanning electron micrographs of fractured thin-film barium titanate capacitor dielectrics on copper foil with 0.5, 1.0, and 2.5 mole % additions of barium borate (25 mole % barium oxide-75 mole % boron oxide) glass flux to the dielectric.
Figure 10B:
Figure 10C:
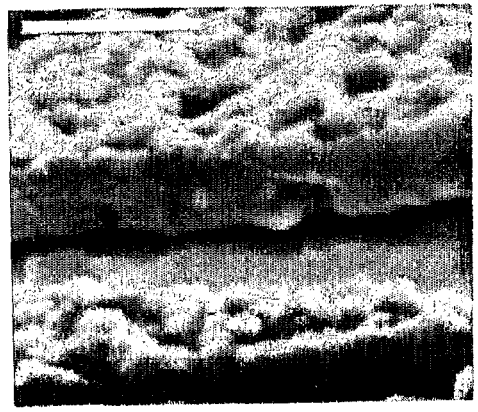

Barium titanate thin-film capacitors were prepared on copper foil using the process as described in FIG. 2. The compositions contained 0, 0.5, and 1.0 mole % barium borate (25 mole % barium oxide-75 mole % boron oxide) glass flux additions by addition of the appropriate amounts of barium acetate and triethyl borate to the barium titanate solution Annealing was performed at 900° C. for 30 minutes, under an atmosphere of a partial pressure of oxygen of $10^{-12}$ atmospheres. The dielectrics were re-oxygenated after the annealing process for 30 minutes at 450° C., under a partial pressure of oxygen of $10^{-4}$ atmospheres. The resultant maximum dielectric constants or relative permittivities of the pure and barium borate fluxed barium titanate films were approximately 1500, 2400, and approximately 3000 for 0 mole %, 0.5 mole % and 1.0 mole % barium borate (25 mole % barium oxide-75 mole % boron oxide) glass flux additions respectively, as shown in FIG. 8. The relative permittivity and loss factor versus field strength of the barium titanate film containing 1.0 mole % barium borate (25 mole % barium oxide-75 mole % boron oxide) glass flux addition is shown in FIG. 9. Cross sectional scanning electron micrograph of fractured samples of the barium titanate films are shown in FIG. 10 (a-c). The effect of the flux on the grain size of the barium titanate is shown in FIG. 15.

Examples 10-12

Figure 11:
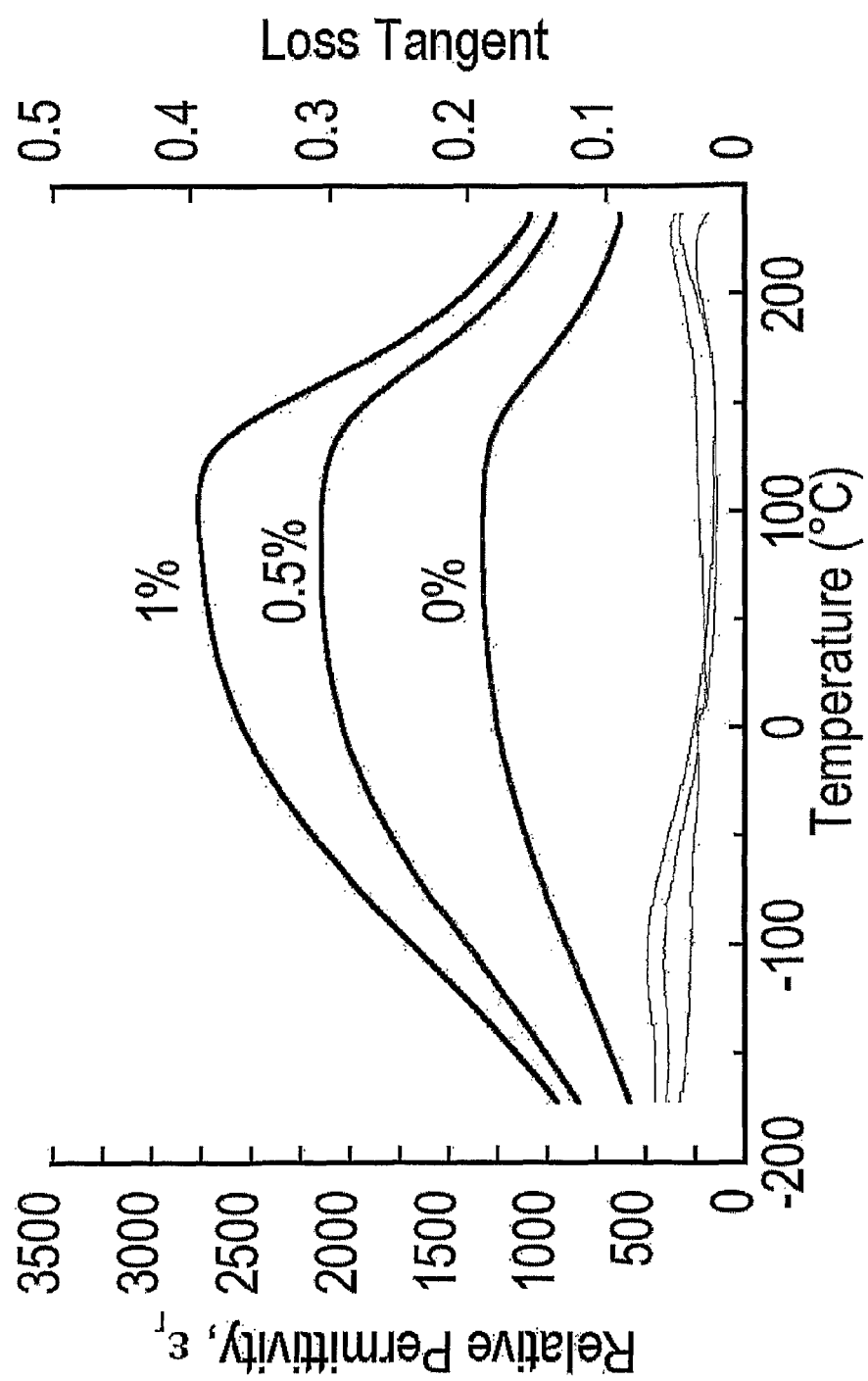
FIG. 11 is a plot of dielectric permittivity and loss tangent versus temperature of barium titanate thin films on copper foil containing 0.5, 1.0, and 2.5 mole % additions of barium borate (33 mole % barium oxide-67 mole % boron oxide) glass flux to the dielectric.
Figure 12A:
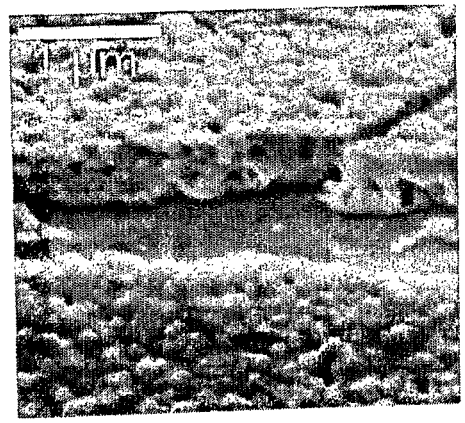
FIG. 12 is series of cross-sectional scanning electron micrographs of fractured thin-film barium titanate capacitor dielectrics on copper foil with 0.5, 1.0, and 2.5 mole % additions of barium borate (33 mole % barium oxide-67 mole % boron oxide) glass flux to the dielectric.
Figure 12B:
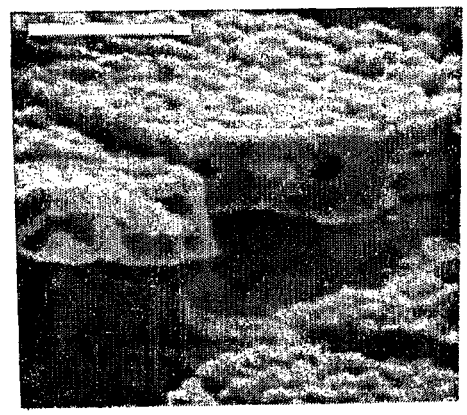
Figure 12C:

Barium titanate thin-film capacitors were prepared on copper foil using the process as described in FIG. 2. The compositions contained 0, 0.5, and 1.0 mole % barium borate (33 mole % barium oxide-67 mole % boron oxide) glass flux additions by addition of the appropriate amounts of barium acetate and triethyl borate to the barium titanate solution Annealing was performed at 900° C. for 30 minutes, under an atmosphere of a partial pressure of oxygen of $10^{-12}$ atmospheres. The dielectrics were re-oxygenated after the annealing process for 30 minutes at 450° C., under a partial pressure of oxygen of $10^{-4}$ atmospheres. The resultant maximum dielectric constants or relative permittivities of the pure and barium borate (33 mole % barium oxide-67 mole % boron oxide) fluxed barium titanate films were approximately 1500, 2200, and 2700 for 0, 0.5, and 1.0 mole % barium borate (33 mole % barium oxide-67 mole % boron oxide) glass flux additions respectively, as shown in FIG. 11. Cross sectional scanning electron micrograph of fractured samples of the barium titanate films are shown in FIG. 12 (a-c). The effect of the flux on the grain size of the barium titanate is shown in FIG. 15.

Examples 13-15

Figure 13:
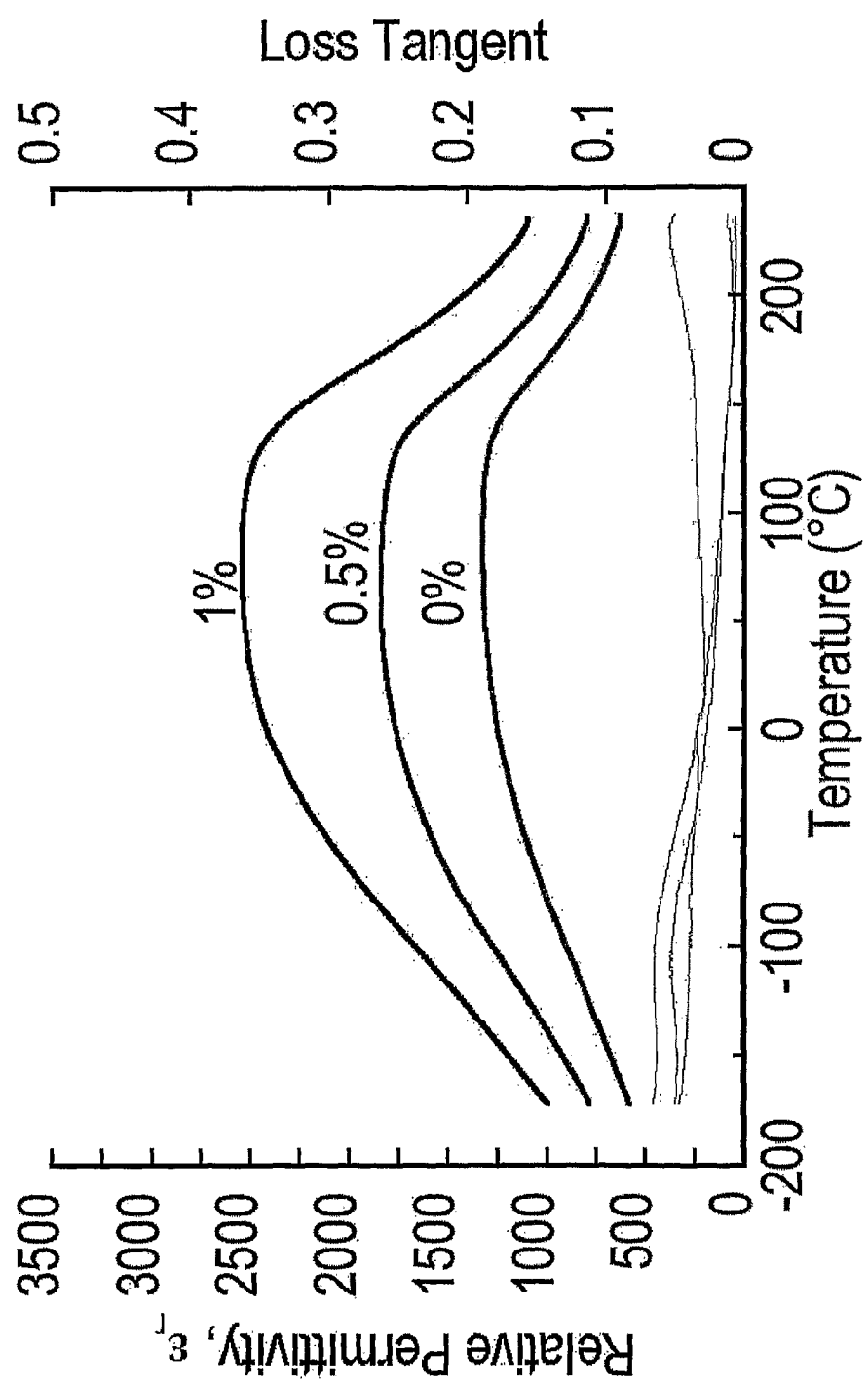
FIG. 13 is a plot of dielectric permittivity and loss tangent versus temperature of barium titanate thin films containing 0, 0.5, and 1 mole % additions of barium borate (37 mole % barium oxide-63 mole % boron oxide) glass flux to the dielectric.
Figure 14A:
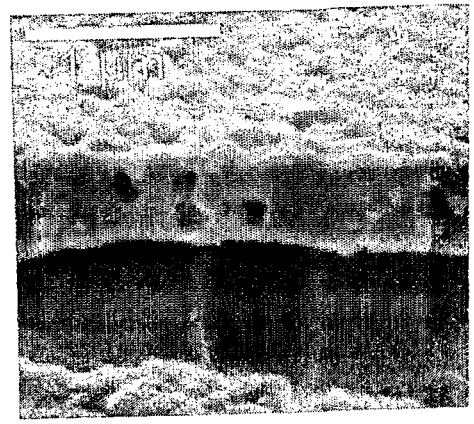
FIG. 14 is series of cross-sectional scanning electron micrographs of fractured thin-film barium titanate capacitor dielectrics on copper foil with 0.5, 1.0, and 2.0 mole % additions of barium borate (37 mole % barium oxide-63 mole % boron oxide) glass flux to the dielectric.
Figure 14B:
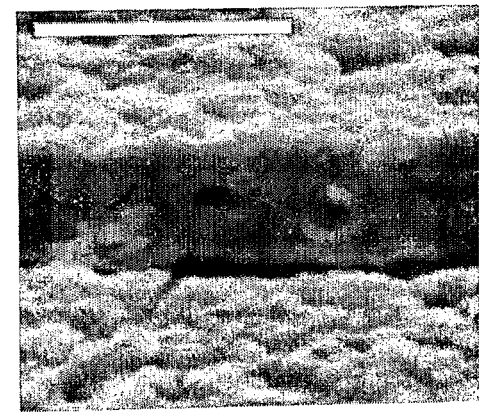
Figure 14C:
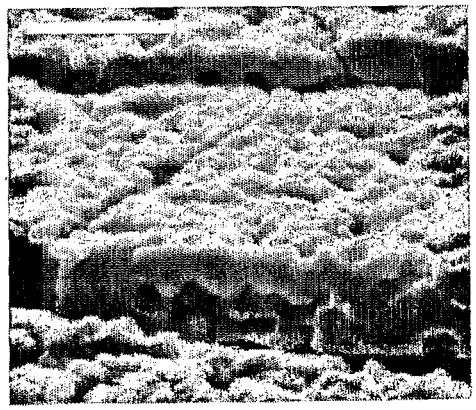

Barium titanate thin-film capacitors were prepared on copper foil using the process as described in FIG. 2. The compositions contained 0, 0.5, and 1.0 mole % barium borate (37 mole % barium oxide-63 mole % boron oxide) glass flux additions by addition of the appropriate amounts of barium acetate and triethyl borate to the barium titanate solution Annealing was performed at 900° C. for 30 minutes, under an atmosphere of a partial pressure of oxygen of $10^{-12}$ atmospheres. The dielectrics were re-oxygenated after the annealing process for 30 minutes at 450° C., under a partial pressure of oxygen of $10^{-4}$ atmospheres. The resultant maximum dielectric constants or relative permittivities of the pure and barium borate (37 mole % barium oxide-63 mole % boron oxide) fluxed barium titanate films were approximately 1500, 1900, and 2600 for 0, 0.5 and 1.0 mole % barium borate (37 mole % barium oxide-63 mole % boron oxide) glass flux additions respectively, as shown in FIG. 13. Cross sectional scanning electron micrograph of fractured samples of the barium titanate films are shown in FIG. 14 (a-c). The effect of the flux on the grain size of the barium titanate is shown in FIG. 15.

Examples 16-18

Figure 16A:
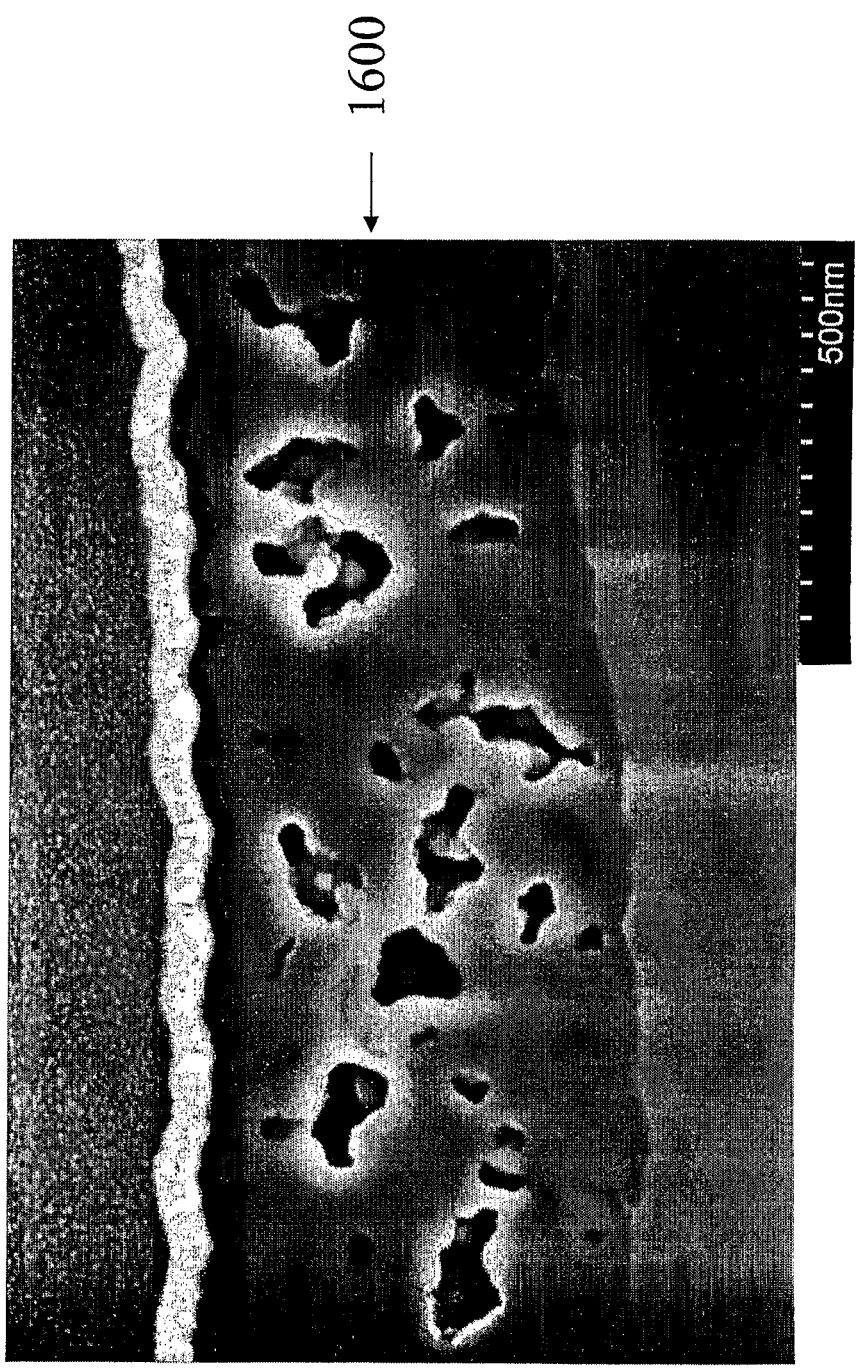
FIG. 16 is series of FIB images of thin-film barium strontium titanate ($Ba_{0.65}Sr_{0.35}TiO_3$) capacitor dielectrics on copper foil with additions of 0, 2.5, and 5 mole % boron oxide glass flux to the dielectric wherein the dielectric layer is identified by the marker 1600.
Figure 16B:
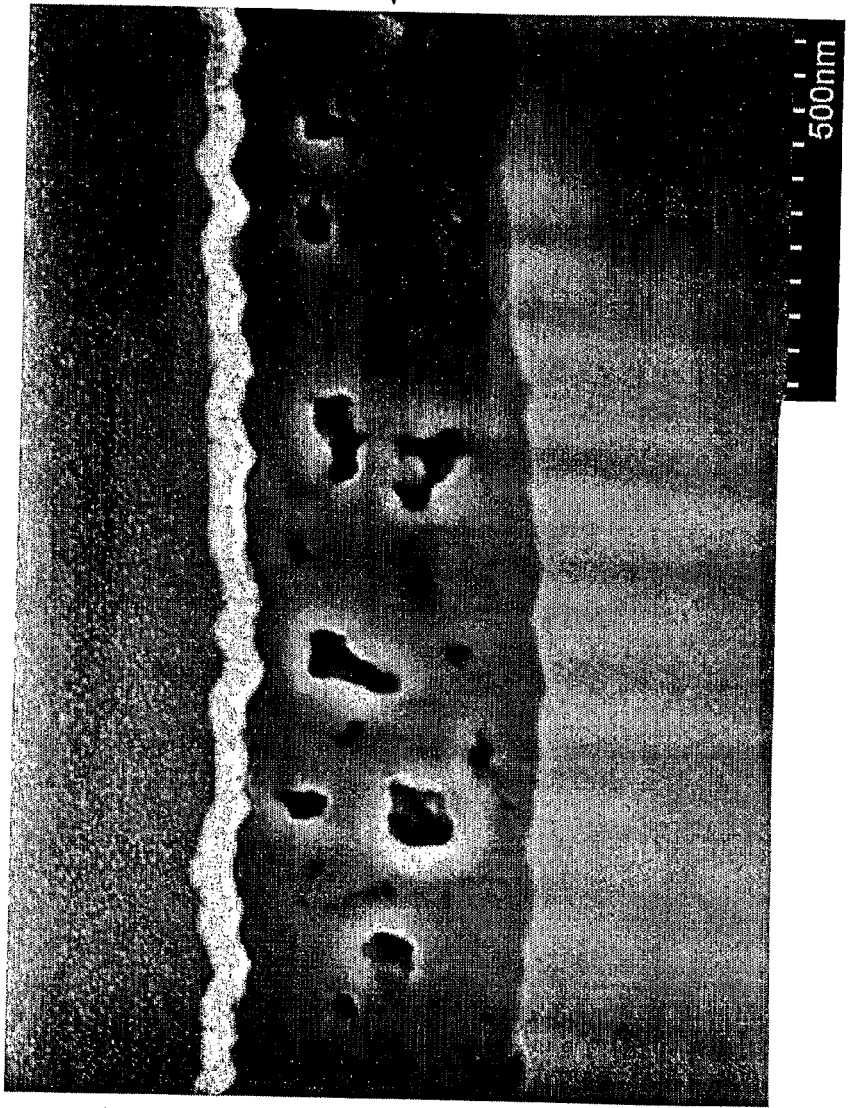
Figure 16C:
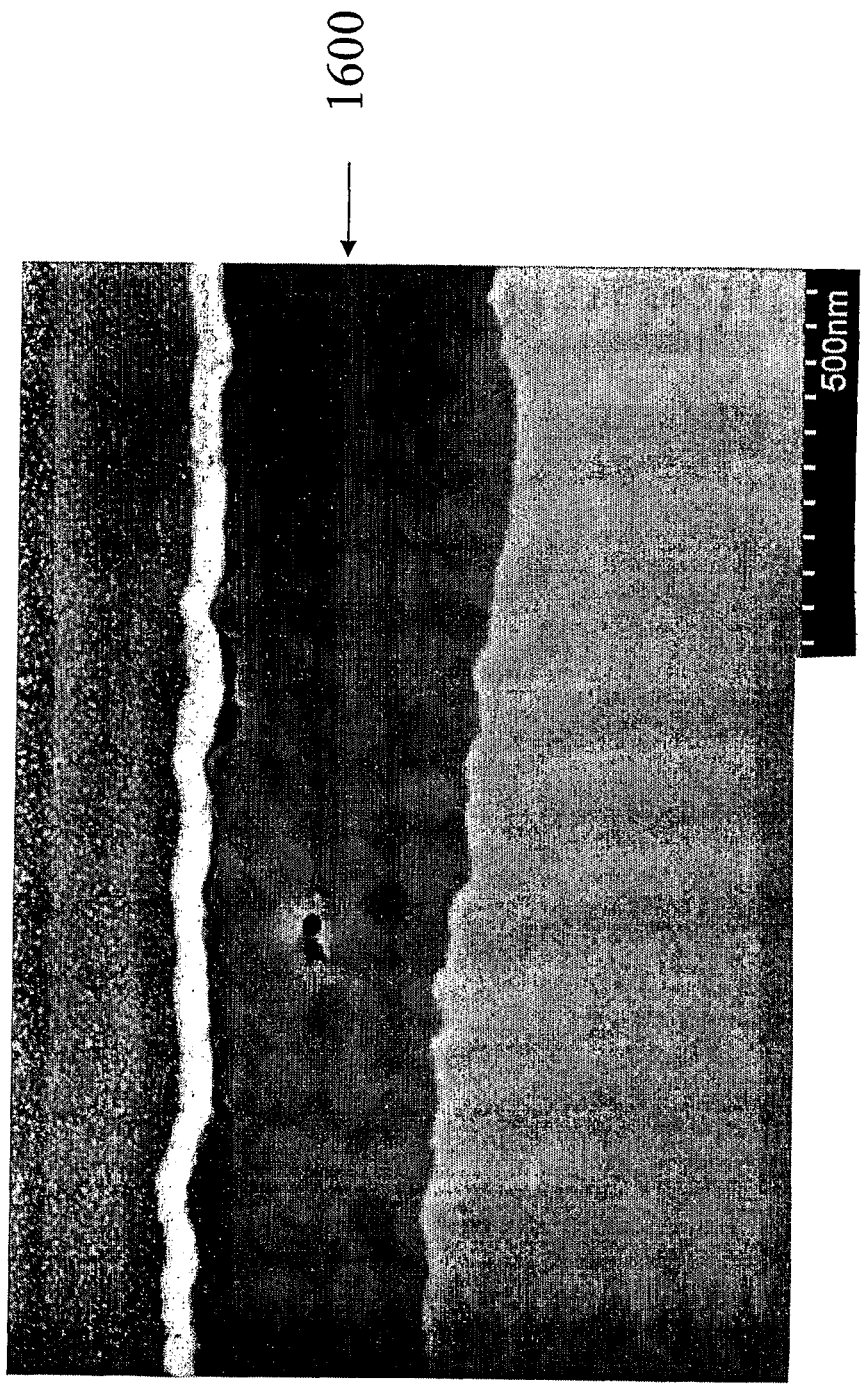
Figure 17:
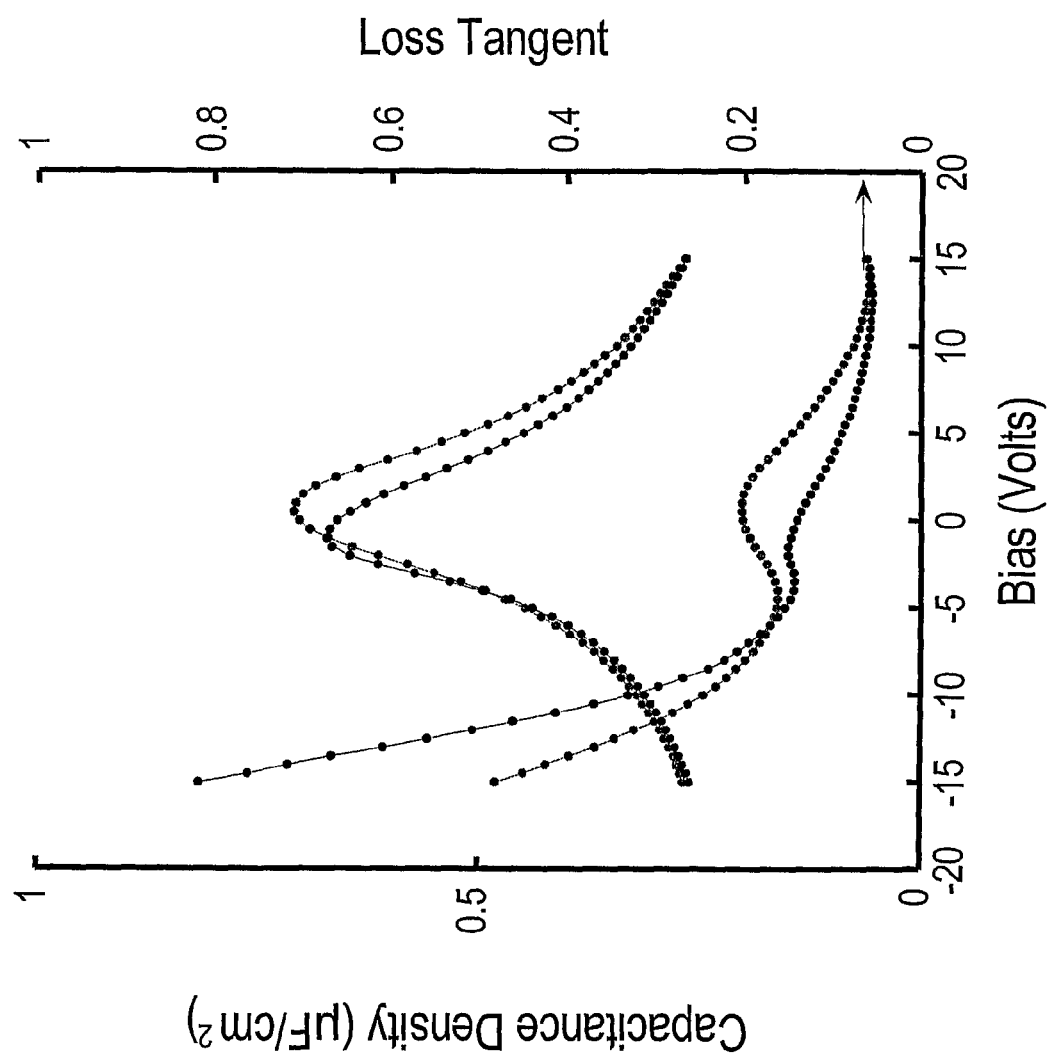
FIGS. 17-20 are plots of capacitance density and loss tangent for barium titanate thin film capacitors with 1.0, 1.5, 2.5, and 5 mole % additions of barium phosphate glass flux to the dielectric.
Figure 18:
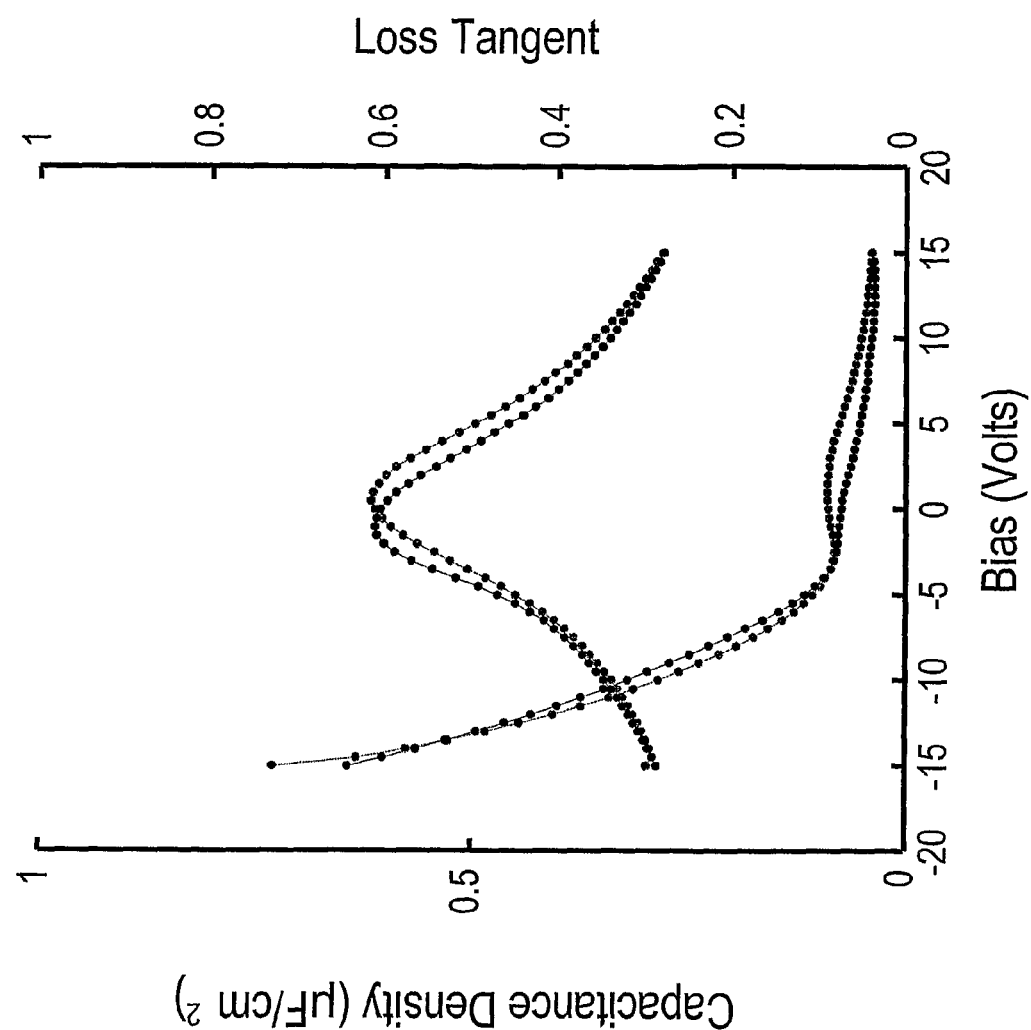
Figure 19:
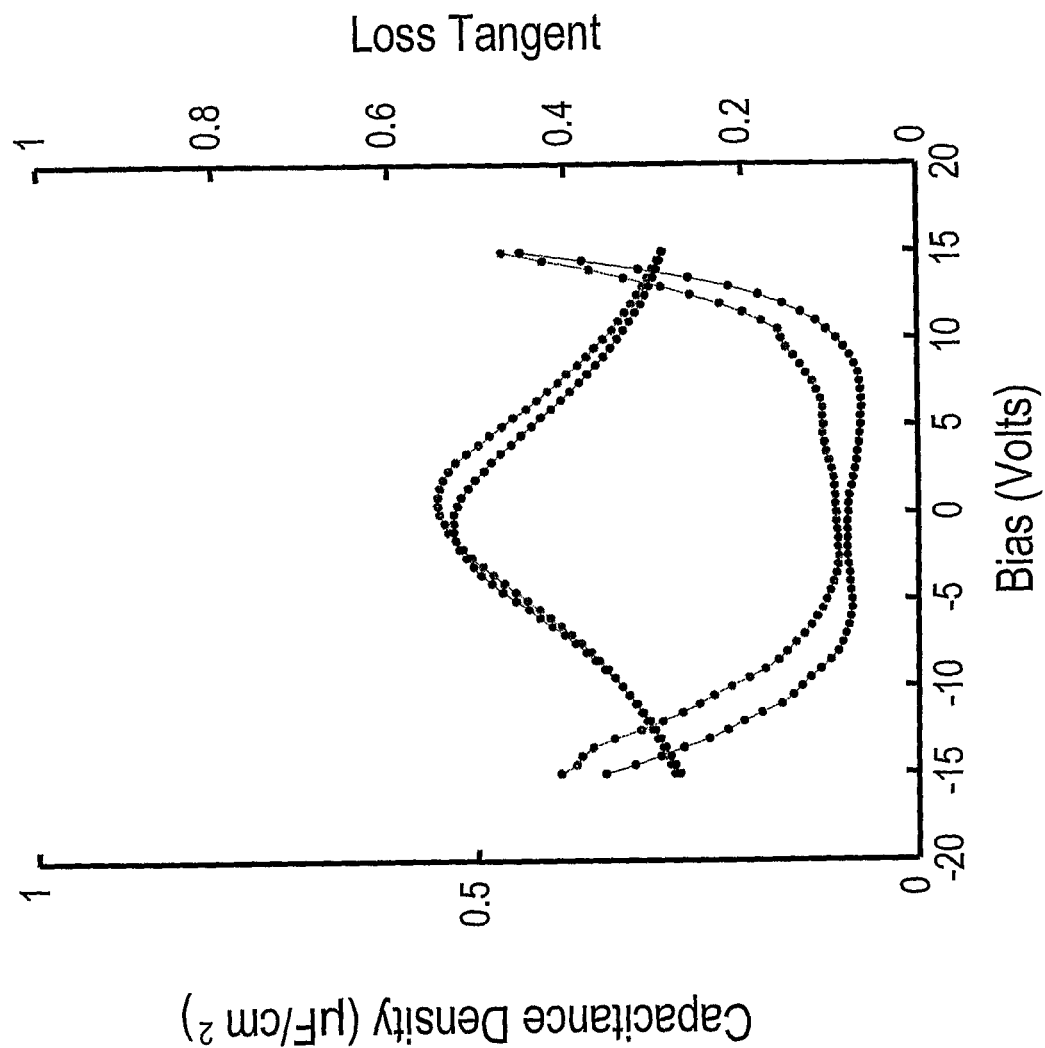
Figure 20:
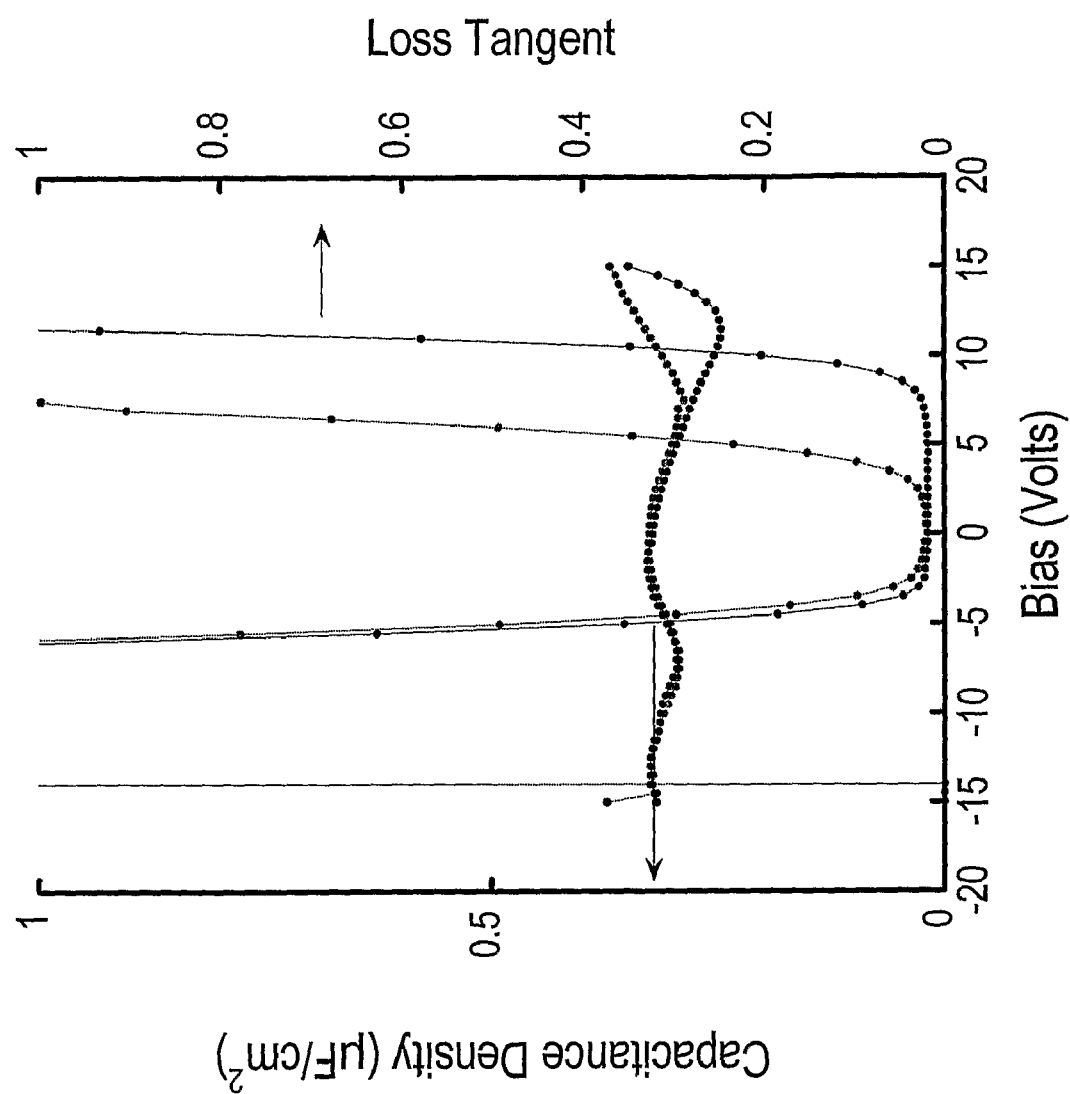

Barium strontium titanate ($Ba_{0.65}Sr_{0.35}TiO_3$) thin-film capacitor dielectrics were prepared on copper foil using the process as described in FIG. 2. The compositions contained 0, 2.5, and 5.0 mole % boron oxide glass flux additions by addition of the appropriate amounts of tri-n-butylborate to the barium titanate solution Annealing was performed at 900° C. for 30 minutes, under an atmosphere of a partial pressure of oxygen of $10^{-12}$ atmospheres. Cross-sections of the dielectrics were made and focused ion beam (FIB) images were taken of the cross-sections to show the porosity level. The images are shown in FIG. 16 (a-c) wherein the dielectric is identified by the market 1600.

Examples 19-22

Figure 21:
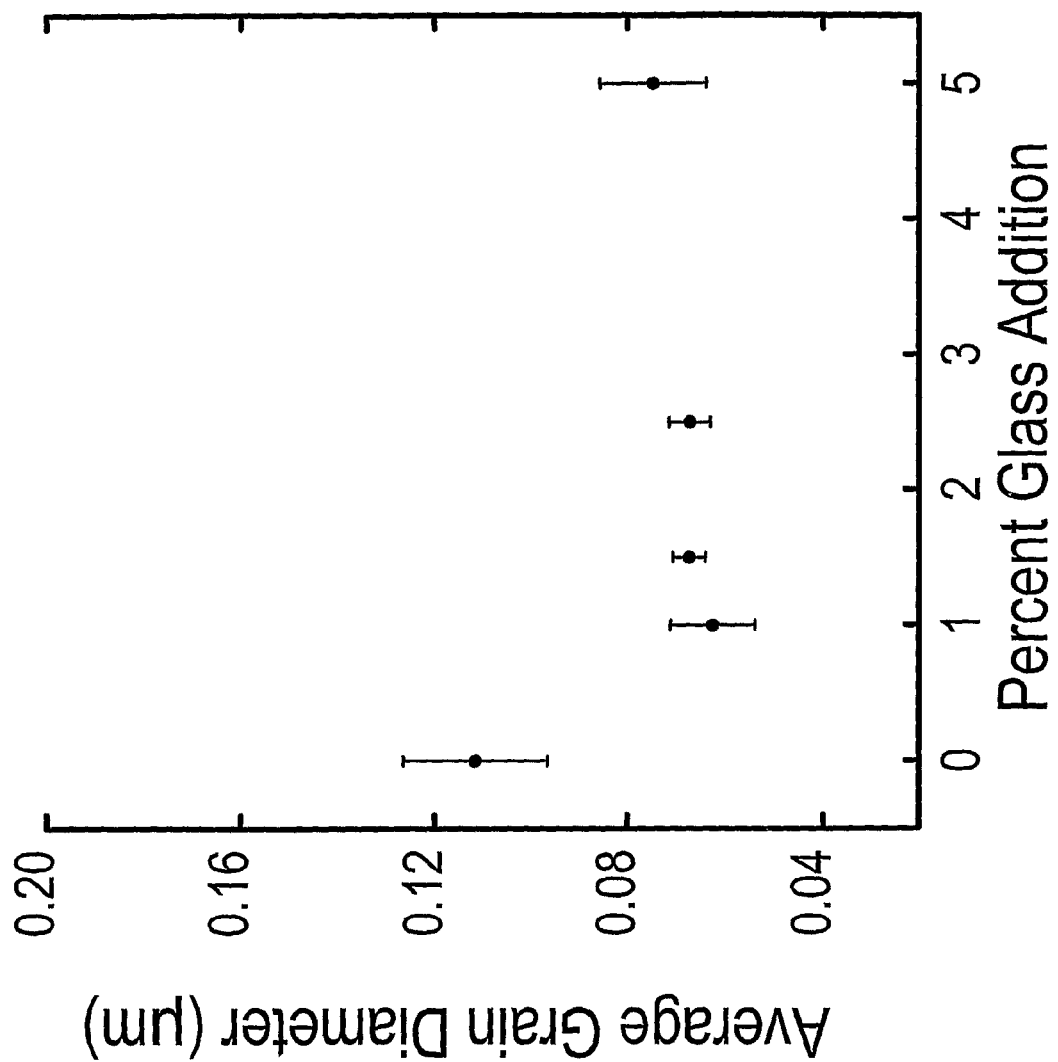
FIG. 21 is a plot showing the effects of barium phosphate additions on the grain size of barium titanate thin films.

Barium titanate thin-film capacitors were prepared on copper foil using the process as described in FIG. 2. The compositions contained 1, 1.5, 2.5, and 5.0 mole % barium phosphate (47.5 mole % barium oxide-52.5 mole % phosphorus pentoxide) glass flux additions by addition of the appropriate amounts of barium acetate and di-2-ethylhexyl phosphoric acid to the barium titanate solution Annealing was performed at 900° C. for 30 minutes, under an atmosphere of a partial pressure of oxygen of $10^{-12}$ atmospheres. The dielectrics were re-oxygenated after the annealing process for 30 minutes at 450° C., under a partial pressure of oxygen of $10^{-4}$ atmospheres. The resultant maximum capacitance densities of the barium phosphate fluxed barium titanate films were approximately 0.75, 0.65, 0.6, and 0.3 $\mu F/cm^2$ for 1.0, 1.5, 2.5, and 5.0 mole % barium phosphate (47.5 mole % barium oxide-52.5 mole % phosphorus pentoxide) glass flux additions respectively, as shown in FIGS. 17-20. The effect on grain size of the barium titanate films with additions of barium phosphate flux additions is shown in FIG. 21.

As can be seen in the series of micrographs in FIGS. 6, 7, 10, 12, 14 and 16 the addition of small amounts of boron oxide or barium borate (25/75, 33-67, and 37-63 molecular ratios of barium oxide to boron oxide) glass flux significantly improves the densification of the barium titanate thin films. In general, as the amount of flux increases, the nature of the porosity changes from interconnected porosity to isolated pores. Interconnected pores are undesirable as they can form channels for moisture penetration that can cause long term reliability issues. From the micrographs, it can be estimated that between approximately 1 and 2 mole % of boron oxide or barium borate glass flux can achieve a microstructure with isolated porosity.

As can be seen from FIGS. 4, 8, 11 and 13 the addition of small amounts of boron oxide or barium borate raises the maximum dielectric constant. This indicates that any dilution effects of the boron oxide or barium borate glass at the levels investigated are less than the improvements in dielectric constants due to higher density. As also can be seen, over the temperature range of −55° C. to +125° C., the dielectric constant varies no greater than approximately 15%.

FIGS. 5 and 9 shows the relative dielectric permittivity and loss factor versus field strength of barium titanate with 1.38 mole % boron oxide and 1 mole % (25 mole % barium oxide-75 mole % boron oxide). As can be seen, the dielectric constants are between 2500 and 3000 which compares quite well with dielectric constants measured from dense compacts made with powders and exhibiting similar grain sizes. This again indicates that any dilution effects of the barium borate glass at the levels investigated are less than the improvements in dielectric constants due to higher density. In addition, the loss factors show good values to quite high field strengths.

FIG. 15 shows the effect of the barium borate addition on grain size of barium titanate. As can be seen, the barium borate additions promote grain growth for the same annealing conditions. This will account for some of the increase in dielectric constant in combination with the increased density. Additions of 3 mole % and higher caused some exaggerated grain growth to occur making average grain size determination difficult.

FIGS. 17-20 show the capacitance density and loss factor for barium titanate thin-films containing from 1 to 5 mole % barium phosphate annealed under a partial pressure of oxygen of $10^{-12}$ atmospheres. Even though the thin-films showed equivalent densification characteristics to those with barium borate additions, as can be seen, the capacitance density is reduced as compared to pure barium titanate or barium titanate thin-films with equivalent barium borate glass flux additions.

FIG. 21 shows the effect of barium phosphate additions on the grain size of barium titanate thin films. As can be seen, the grain sizes are significantly reduced to less than 0.08 microns, thus explaining why the capacitance density is so low. It is assumed the barium phosphate acted as a grain growth inhibitor whereas barium borate acts as a grain growth enhancer.

The use of barium phosphate fluxes, therefore, would be very useful in capacitors wherein the dielectric layers are very thin, such as less than 0.5 microns and where high-density microstructures are necessary.

What is claimed is:

1. A method of making a dielectric composition having a high dielectric constant via chemical solution deposition, comprising:

forming a dielectric precursor composition mixture by mixing a solution comprising a high dielectric constant precursor material with a solution comprising a quantity of inorganic glass fluxed material such that the inorganic glass fluxed material comprises between 0.5 and 5 mole percent of the dielectric precursor composition mixture;

coating a metal foil substrate via chemical solution deposition with the dielectric precursor composition mixture to result in a substrate having a dielectric precursor composition mixture coating of discernible thickness; and annealing the coated metal foil substrate at a temperature higher than the softening point of the inorganic glass fluxed material but lower than the melting point of the metal foil substrate to yield and crystallize the dielectric composition, wherein, upon annealing, the dielectric constant of the dielectric composition is in excess of 2500.

2. The method of claim 1, wherein the dielectric composition comprises between 0.05 and 0.5 mole percent dopant of the dielectric composition.

3. The method of claim 1, wherein the dielectric composition comprises a high dielectric constant material selected from the group consisting of barium titanate, barium strontium titanate, lead zirconate titanate, lead magnesium niobate, lead lanthanum zirconate titanate and mixtures thereof.

4. The method of claim 1, wherein the inorganic glass fluxed material is selected from the group consisting of metallic borates, phosphates, fluorides, boron oxide, barium borate flux and mixtures thereof.

5. The method of claim 1, wherein the dielectric precursor composition mixture coating has a thickness in the range between 0.1 microns and 2.0 microns.

6. A printed wiring circuit board comprising a capacitor comprising a dielectric composition made by the method of claim 1.

7. The method of claim 1, further comprising forming a conductive layer over the annealed dielectric composition.

8. A capacitor made by the method of claim 7.

9. A printed wiring circuit board comprising a capacitor made by the method of claim 8.

10. A method of making a dielectric composition having a high dielectric constant via chemical solution deposition, comprising:

forming a dielectric composition mixture by mixing a solution comprising a high dielectric constant material with a solution comprising a quantity of inorganic glass fluxed material such that the inorganic glass fluxed material comprises between 0.5 and 5 mole percent of the dielectric composition mixture;

coating a substrate with the dielectric composition mixture to result in a substrate having a dielectric composition mixture coating of discernible thickness;

annealing the coated substrate at a temperature higher than the softening point of the inorganic glass fluxed material but lower than the softening point or melting point of the substrate to yield the dielectric composition, wherein the dielectric constant of the annealed dielectric composition is in excess of 2500; and re-oxygenating the annealed dielectric composition.

\* \* \* \* \*

UNITED STATES PATENT AND TRADEMARK OFFICE
CERTIFICATE OF CORRECTION

PATENT NO. : 8,183,108 B2
APPLICATION NO. : 12/301791
DATED : May 22, 2012
INVENTOR(S) : Borland et al.

It is certified that error appears in the above-identified patent and that said Letters Patent is hereby corrected as shown below:

In Column 2, Lines 10-11, delete "comprise" and insert -- comprise: --, therefor.

In Column 2, Line 43, delete "oxide" and insert -- oxide. --, therefor.

In Column 6, Line 19, delete "tri-n-butylborane;" and insert -- tri-n-butylborate; --, therefor.

In Column 8, Line 7, delete "precursor" and insert -- precursor. --, therefor.

In Column 8, Line 34, delete "dielectric" and insert -- dielectric. --, therefor.

In Column 10, Line 25, delete "solution" and insert -- solution. --, therefor.

In Column 10, Line 40, delete "solution" and insert -- solution. --, therefor.

In Column 10, Line 67, delete "solution" and insert -- solution. --, therefor.

In Column 11, Line 24, delete "solution" and insert -- solution. --, therefor.

In Column 11, Line 48, delete "solution" and insert -- solution. --, therefor.

In Column 11, Line 64, delete "solution" and insert -- solution. --, therefor.

Signed and Sealed this
Ninth Day of October, 2012

David J. Kappos
*Director of the United States Patent and Trademark Office*